US010643727B2

(12) United States Patent
Zhou et al.

(10) Patent No.: US 10,643,727 B2
(45) Date of Patent: *May 5, 2020

(54) APPARATUS AND METHODS FOR PROTECTION AGAINST INADVERTENT PROGRAMMING OF FUSE CELLS

(71) Applicant: Skyworks Solutions, Inc., Woburn, MA (US)

(72) Inventors: Bo Zhou, Acton, MA (US); Guillaume Alexandre Blin, Carlisle, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/438,913

(22) Filed: Jun. 12, 2019

(65) Prior Publication Data

US 2019/0295672 A1    Sep. 26, 2019

Related U.S. Application Data

(63) Continuation of application No. 15/798,786, filed on Oct. 31, 2017, now Pat. No. 10,360,988.

(60) Provisional application No. 62/504,705, filed on May 11, 2017, provisional application No. 62/416,332, filed on Nov. 2, 2016.

(51) Int. Cl.
*G11C 17/16* (2006.01)
*G11C 17/18* (2006.01)
*H01L 27/112* (2006.01)
*H01L 27/02* (2006.01)

(52) U.S. Cl.
CPC .............. *G11C 17/18* (2013.01); *G11C 17/16* (2013.01); *H01L 27/0248* (2013.01); *H01L 27/11206* (2013.01)

(58) Field of Classification Search
None
See application file for complete search history.

(56) References Cited

U.S. PATENT DOCUMENTS

| | | |
|---|---|---|
| 4,686,384 A | 8/1987 | Harvey et al. |
| 4,730,129 A | 3/1988 | Kunitoki et al. |
| 4,837,520 A | 6/1989 | Golke et al. |
| 5,319,592 A | 6/1994 | Nguyen |
| 5,416,740 A | 5/1995 | Fujita et al. |
| 5,446,402 A | 8/1995 | Yoshimori |

(Continued)

*Primary Examiner* — Douglas King
(74) *Attorney, Agent, or Firm* — Knobbe, Martens, Olson & Bear, LLP

(57) ABSTRACT

Apparatus and methods for protection against inadvertent programming of fuse cells are provided herein. In certain configurations, a fuse system includes a fuse protection diode, a fuse, a fuse programming transistor and a cascode transistor electrically connected in series between a cathode of the fuse protection diode and the fuse, a power supply pad electrically connected to an anode of the fuse protection diode and that receives a power supply voltage, and a biasing circuit powered by the power supply voltage and including a voltage regulator that generates a regulated voltage and a level shifter that provides a fuse programming signal to a gate of the fuse programming transistor. The level shifter controls the fuse programming signal with the power supply voltage in a first state of a control signal, and controls the fuse programming signal with the regulated voltage in a second state of the control signal.

20 Claims, 22 Drawing Sheets

(56) References Cited

U.S. PATENT DOCUMENTS

| | | |
|---|---|---|
| 5,731,760 A | 3/1998 | Ramirez |
| 6,133,778 A | 10/2000 | Kim et al. |
| 6,150,868 A | 11/2000 | Kim et al. |
| 6,229,378 B1 | 5/2001 | Gourley |
| 6,236,599 B1 | 5/2001 | Goto |
| 6,346,845 B1 | 2/2002 | Choi |
| 6,525,983 B2 | 2/2003 | Wilkins |
| 6,545,526 B2 | 4/2003 | Hönigschmid |
| 6,909,639 B2 | 6/2005 | Park et al. |
| 6,980,035 B1 | 12/2005 | Zhou et al. |
| 7,432,755 B1 | 10/2008 | Park et al. |
| 9,324,448 B2 | 4/2016 | Hall |
| 10,255,982 B2 | 4/2019 | Zhou et al. |
| 10,360,988 B2 * | 7/2019 | Zhou .................. G11C 17/16 |
| 2001/0050406 A1 | 12/2001 | Akita et al. |
| 2004/0012070 A1 | 1/2004 | Park |
| 2006/0152990 A1 | 7/2006 | Huang |
| 2006/0193185 A1 | 8/2006 | Takai |
| 2007/0221919 A1 | 9/2007 | Sato et al. |
| 2008/0217734 A1 | 9/2008 | Lin et al. |
| 2010/0014373 A1 | 1/2010 | Anand et al. |
| 2011/0273949 A1 | 11/2011 | Chen et al. |
| 2014/0300413 A1 | 10/2014 | Høyerby et al. |
| 2015/0228436 A1 | 8/2015 | Ungar et al. |
| 2015/0279478 A1 | 10/2015 | Hall |
| 2017/0300076 A1 | 10/2017 | Liang et al. |
| 2018/0005705 A1 | 1/2018 | Hall |
| 2019/0180833 A1 | 6/2019 | Zhou et al. |

* cited by examiner

APPARATUS AND METHODS FOR PROTECTION AGAINST INADVERTENT PROGRAMMING OF FUSE CELLS

CROSS-REFERENCE TO RELATED APPLICATIONS

This application is a continuation of U.S. application Ser. No. 15/798,786, filed Oct. 31, 2017 and titled "APPARATUS AND METHODS FOR PROTECTION AGAINST INADVERTENT PROGRAMMING OF FUSE CELLS," which claims the benefit of priority under 35 U.S.C. § 119 of U.S. Provisional Patent Application No. 62/504,705, filed May 11, 2017 and titled "APPARATUS AND METHODS FOR PROTECTION AGAINST INADVERTENT PROGRAMMING OF FUSE CELLS," and of U.S. Provisional Patent Application No. 62/416,332, filed Nov. 2, 2016 and titled "APPARATUS AND METHODS FOR PROTECTION AGAINST INADVERTENT PROGRAMMING OF FUSE CELLS," each of which is herein incorporated by reference in its entirety.

BACKGROUND

Technical Field

Embodiments of the invention relate to electronic systems, and in particular, to programmable fuse cells.

Description of Related Technology

Fuse cells can be used to store data in a semiconductor die. For example, the semiconductor die can be fabricated with one or more programmable fuse cells. Additionally, a particular fuse cell can be programmed using a relatively high programming current that alters the resistivity of the fuse cell, thereby programming or blowing the fuse cell. Additionally, the resistivity of the fuse cell can be sensed to detect a value of the data stored therein.

SUMMARY

In certain embodiments, the present disclosure relates to a fuse system for a semiconductor die. The fuse system includes a plurality of pads including a first pad and a second pad, a fuse, a fuse programming switch in series with the fuse, a biasing circuit configured to bias a control input of the fuse programming switch with a fuse programming signal to thereby control a current through the fuse, and a fuse protection diode in series with the fuse programming switch and the fuse between the first pad and the second pad. The fuse protection diode is configured to inhibit accidental programming of the fuse in response to a decrease in a voltage of the first pad relative to a voltage of the second pad.

In some embodiments, the biasing circuit includes a voltage regulator electrically connected between the first pad and the second pad and configured to generate a regulated voltage, and a programming logic circuit configured to generate the fuse programming signal based on the regulated voltage.

In various embodiments, the fuse protection diode is operable to prevent accidental programming of the fuse arising from a delay of the voltage regulator in providing voltage regulation.

In several embodiments, the voltage regulator is a low dropout regulator.

In a number of embodiments, the programming logic circuit includes a level shifter configured to generate the fuse programming signal by level shifting a control signal. The level shifter is configured to control the fuse programming signal to a first voltage level about equal to the voltage of the first pad in a first state of the control signal, and to control the fuse programming signal to a second voltage level about equal to the regulated voltage in a second state of the control signal.

In accordance with some embodiments, the fuse system further includes a serial interface configured to provide a control signal to the programming logic circuit to instruct programming of the fuse.

In several embodiments, the first pad is a shared power supply and fuse programming pad and the second pad is a ground pad.

In a number of embodiments, the fuse system further includes a fuse sensing circuit electrically connected to the fuse and configured to detect a state of the fuse.

In some embodiments, the fuse programming switch is a fuse programming field-effect transistor including a gate controlled by the fuse programming signal and a source electrically connected to a cathode of the fuse protection diode.

In several embodiments, the fuse system further includes a cascode field-effect transistor electrically connected between a drain of the fuse programming field-effect transistor and the fuse.

In accordance with a number of embodiments, the fuse protection diode is implemented as a diode-connected transistor.

According to several embodiments, the fuse protection diode is implemented as a p-n junction diode.

In certain embodiments, the present disclosure relates to a method of protecting from accidental fuse programming. The method includes biasing a control input of a fuse programming switch with a fuse programming signal, controlling a current through the fuse based on the fuse programming signal, the fuse electrically connected in series with the fuse programming switch and a fuse protection diode between a first pad and a second pad, and inhibiting unintended programming of the fuse in response to a decrease in a voltage of the first pad relative to a voltage of the second pad using the fuse protection diode.

In a number of embodiments, the method further includes generating a regulated voltage using a voltage regulator that is electrically connected between the first pad and the second pad, and generating the fuse programming signal based on the regulated voltage.

In several embodiments, the method further includes preventing accidental programming of the fuse arising from a delay of the voltage regulator in providing voltage regulation.

In certain embodiments, the present disclosure relates to a packaged module. The packaged module includes a package substrate and a semiconductor die attached to the package substrate. The semiconductor die includes a fuse protection diode, a fuse programming switch, and a fuse electrically connected in series with one another between a first pad and a second pad. The semiconductor die further includes a biasing circuit configured to bias a control input of the fuse programming switch with a fuse programming signal to thereby control a current through the fuse. The fuse protection diode is configured to inhibit accidental programming of the fuse in response to a decrease in a voltage of the first pad relative to a voltage of the second pad.

In some embodiments, the biasing circuit includes a voltage regulator electrically connected between the first pad and the second pad and configured to generate a regulated voltage, and a programming logic circuit configured to generate the fuse programming signal based on the regulated voltage.

In a number of embodiments, the fuse protection diode is operable to prevent accidental programming of the fuse arising from a delay of the voltage regulator in providing voltage regulation.

In several embodiments, the programming logic circuit includes a level shifter configured to generate the fuse programming signal by level shifting a control signal. The level shifter is configured to control the fuse programming signal to a first voltage level about equal to the voltage of the first pad in a first state of the control signal, and to control the fuse programming signal to a second voltage level about equal to the regulated voltage in a second state of the control signal.

In accordance with a number of embodiments, the first pad is a shared power supply and fuse programming pad and the second pad is a ground pad, and the semiconductor die further includes a core circuit configured to receive power from the first pad and the second pad.

In certain embodiments, the present disclosure relates to a fuse system for a semiconductor die. The fuse system includes a plurality of pads including a first pad and a second pad, a fuse cell, a fuse programming transistor, a bias generator configured to generate a fuse programming voltage that controls a gate of the fuse programming transistor to thereby control a current through the fuse cell, and a fuse protection diode in series with the fuse programming transistor and the fuse cell between the first pad and the second pad. The fuse protection diode is configured to inhibit accidental programming of the fuse cell in response to a decrease in a voltage of the first pad relative to a voltage of the second pad.

In a number of embodiments, the first pad is a shared power supply and fuse programming pad and the second pad is a ground pad.

In several embodiments, an anode of the fuse protection diode is electrically connected to the first pad and a cathode of the fuse protection diode is electrically connected to a source of the fuse programming transistor.

In some embodiments, the fuse protection diode is implemented as a diode-connected transistor.

In accordance with a number of embodiments, the fuse protection diode is implemented as a p-n junction diode.

According to several embodiments, the bias generator includes a voltage regulator that generates a regulated voltage, and a programming logic circuit that generates the fuse programming voltage based on the regulated voltage.

In some embodiments, the programming logic circuit includes a level shifter that generates the fuse programming voltage.

In accordance with certain embodiments, the fuse system further includes a serial interface configured to provide a control signal to the programming logic circuit to instruct programming of the fuse cell.

In several embodiments, the fuse system further includes a fuse sensing circuit electrically connected to the fuse cell and configured to detect a state of the fuse cell.

In a number of embodiments, the fuse system further includes a cascode transistor including a gate controlled by a cascode bias voltage generated by the bias generator, and the cascode transistor is electrically connected in series with the fuse protection diode, the fuse programming transistor, and the fuse cell.

In accordance with some embodiments, the fuse protection diode is between the first pad and the fuse programming transistor.

In several embodiments, the fuse system further includes a fuse protection capacitor electrically connected between a gate of the cascode transistor and a cathode of the fuse protection diode.

According to certain embodiments, the fuse protection diode is between the cascode transistor and the fuse cell.

In a number of embodiments, the fuse system further includes a fuse protection capacitor electrically connected between a gate of the cascode transistor and the first pad.

In some embodiments, the fuse programming transistor and the cascode transistor are p-type.

In several embodiments, the fuse programming transistor and the cascode transistor are n-type.

In a number of embodiments, the fuse system further includes a plurality of fuse cells including the fuse cell, the fuse protection diode shared amongst the plurality of fuse cells.

In certain embodiments, the present disclosure relates to a method of protecting a fuse system of an integrated circuit from accidental programming. The method includes providing a bias generator with a power supply voltage from a first pad and a ground voltage from a second pad, generating a fuse programming voltage using the bias generator, providing the fuse programming voltage to a gate of a fuse programming transistor to control a current through a fuse cell, and inhibiting accidental programming of the fuse cell in response to a decrease in a voltage of the first pad relative to a voltage of the second pad using a fuse protection diode, the fuse protection diode in series with the fuse programming transistor and the fuse cell between the first pad and the second pad.

In some embodiments, the method further includes generating a cascode bias voltage using the bias generator and providing the cascode bias voltage to a gate of the cascode transistor, the cascode transistor in series with the fuse protection diode, the fuse programming transistor, and the fuse cell.

In a number of embodiments, the method further includes inhibiting accidental programming of the fuse cell using a fuse protection capacitor this is electrically connected between the gate of the cascode transistor and the first pad.

In certain embodiments, the present disclosure relates to a packaged module. The packaged module includes a package substrate and a semiconductor die attached to the package substrate. The semiconductor die includes a first pad, a second pad, a fuse cell, a fuse programming transistor, a bias generator configured to generate a fuse programming voltage that controls a gate of the fuse programming transistor to thereby control a current through the fuse cell, and a fuse protection diode in series with the fuse programming transistor and the fuse cell between the first pad and the second pad. The fuse protection diode is configured to inhibit unintended programming of the fuse cell in response to a decrease in a voltage of the first pad relative to a voltage of the second pad.

In a number of embodiments, the first pad is a shared power supply and fuse programming pad and the second pad is a ground pad.

In some embodiments, an anode of the fuse protection diode is electrically connected to the first pad and a cathode of the fuse protection diode is electrically connected to a source of the fuse programming transistor.

In accordance with several embodiments, the fuse protection diode is implemented as a diode-connected transistor.

According to a number of embodiments, the fuse protection diode is implemented as a p-n junction diode.

In some embodiments, the bias generator includes a voltage regulator that generates a regulated voltage, and a programming logic circuit that generates the fuse programming voltage based on the regulated voltage.

In several embodiments, the programming logic circuit includes a level shifter that generates the fuse programming voltage.

In accordance with certain embodiments, the packaged module further includes a serial interface configured to provide a control signal to the programming logic circuit to instruct programming of the fuse cell.

In a number of embodiments, the packaged module further includes a fuse sensing circuit electrically connected to the fuse cell and configured to detect a state of the fuse cell.

In several embodiments, the packaged module further includes a cascode transistor including a gate controlled by a cascode bias voltage generated by the bias generator, the cascode transistor electrically connected in series with the fuse protection diode, the fuse programming transistor, and the fuse cell.

In accordance with some embodiments, the fuse protection diode is between the first pad and the fuse programming transistor.

In a number of embodiments, the packaged module further includes a fuse protection capacitor electrically connected between a gate of the cascode transistor and a cathode of the fuse protection diode.

In several embodiments, the fuse protection diode is between the cascode transistor and the fuse cell.

In some embodiments, the packaged module further includes a fuse protection capacitor electrically connected between a gate of the cascode transistor and the first pad.

In accordance with various embodiments, the fuse programming transistor and the cascode transistor are p-type.

According to certain embodiments, the fuse programming transistor and the cascode transistor are n-type.

In several embodiments, the packaged module further includes a plurality of fuse cells including the fuse cell, the fuse protection diode shared amongst the plurality of fuse cells.

In certain embodiments, the present disclosure relates to a semiconductor die. The semiconductor die includes a plurality of pads including a first pad and a second pad, a plurality of fuse cells including a first fuse cell and a second fuse cell, a plurality of fuse programming transistors including a first fuse programming transistor in series with the first fuse cell and a second fuse programming transistor in series with the second fuse cell, a bias generation circuit configured to generate a fuse programming voltage that controls a gate of the first fuse programming transistor to thereby control a current through the first fuse cell, and a first fuse protection diode in series with the first fuse programming transistor and the fuse cell between the first pad and the second pad. The first fuse protection diode is configured to inhibit accidental programming of the fuse cell in response to a decrease in a voltage of the first pad relative to a voltage of the second pad.

In a number of embodiments, the first fuse protection diode in series with the second fuse programming transistor and the second fuse cell between the first pad and the second pad.

In several embodiments, the semiconductor die further includes a second fuse protection diode in series with the second fuse programming transistor and the second fuse cell between the first pad and the second pad.

In accordance with some embodiments, the semiconductor die further includes a first cascode transistor electrically connected in series with the first fuse programming transistor and the first fuse cell, and a second cascode transistor electrically connected in series with the second fuse programming transistor and the second fuse cell.

In a number of embodiments, the semiconductor die further includes a first fuse protection capacitor electrically connected between a gate of the first cascode transistor and the first pad.

In several embodiments, the first fuse protection capacitor is also electrically connected between a gate of the second cascode transistor and the first pad.

In accordance with various embodiments, the first fuse protection diode in series with the second fuse programming transistor, the second cascode transistor, and the second fuse cell between the first pad and the second pad.

According to some embodiments, the semiconductor die further includes a second fuse protection diode in series with the second fuse programming transistor, the second cascode transistor, and the second fuse cell between the first pad and the second pad.

In several embodiments, the first pad is a shared power supply and fuse programming pad and the second pad is a ground pad.

In a number of embodiments, an anode of the first fuse protection diode is electrically connected to the first pad and a cathode of the first fuse protection diode is electrically connected to a source of the first fuse programming transistor.

In some embodiments, the first fuse protection diode is implemented as a diode-connected transistor.

In several embodiments, the first fuse protection diode is implemented as a p-n junction diode.

According to various embodiments, the bias generation circuit includes a voltage regulator that generates a regulated voltage, and a programming logic circuit that generates the fuse programming voltage based on the regulated voltage.

In a number of embodiments, the programming logic circuit includes a level shifter that generates the fuse programming voltage.

In several embodiments, the semiconductor die further includes a serial interface configured to provide a control signal to the programming logic circuit to instruct programming of the fuse cell.

In accordance with certain embodiments, the semiconductor die further includes a fuse sensing circuit electrically connected to the fuse cell and configured to detect a state of the fuse cell.

In several embodiments, the semiconductor die further includes a first cascode transistor including a gate controlled by a cascode bias voltage generated by the bias generation circuit, the first cascode transistor electrically connected in series with the first fuse protection diode, the first fuse programming transistor, and the first fuse cell.

In some embodiments, the first fuse protection diode is between the first pad and the first fuse programming transistor.

In a number of embodiments, the semiconductor die further includes a fuse protection capacitor electrically connected between a gate of the first cascode transistor and a cathode of the first fuse protection diode.

In various embodiments, the first fuse protection diode is between the first cascode transistor and the first fuse cell.

According to certain embodiments, the semiconductor die further includes a first fuse protection capacitor electrically connected between a gate of the first cascode transistor and the first pad.

In a number of embodiments, the first fuse programming transistor and the first cascode transistor are p-type.

In several embodiments, the first fuse programming transistor and the first cascode transistor are n-type.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
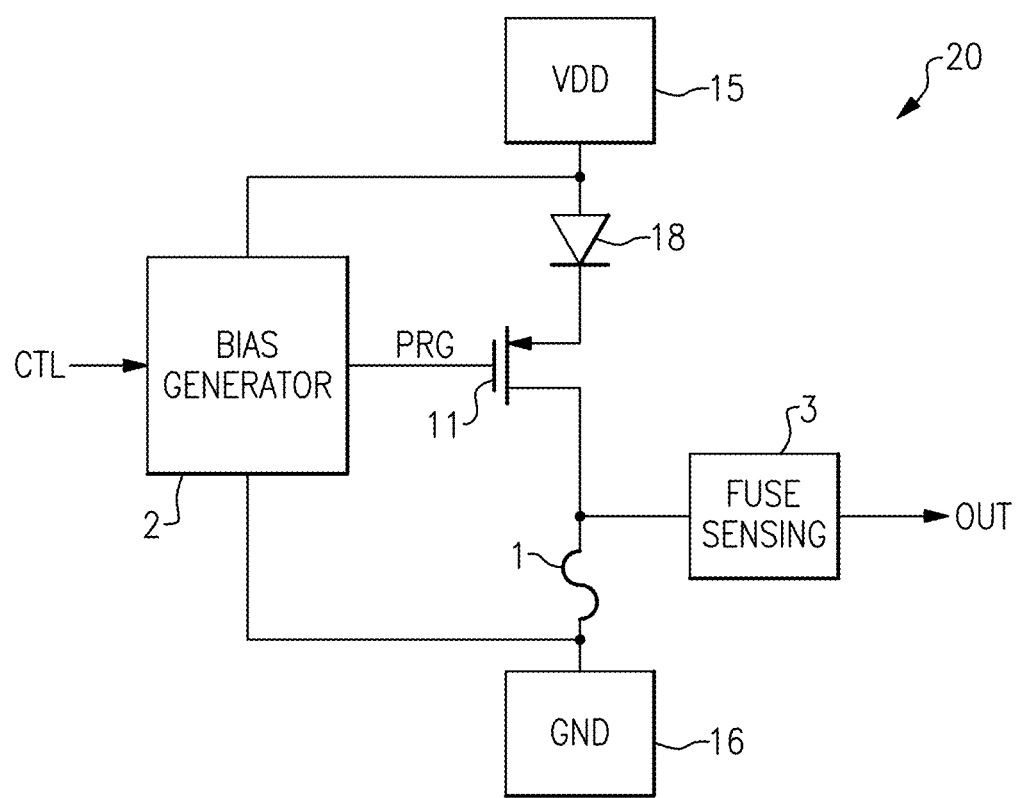
FIG. 1A is a schematic diagram of one embodiment of a fuse system for a semiconductor die or integrated circuit (IC).

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Examples of Fuse Systems with a Fuse Protection Diode

A semiconductor die or integrated circuit (IC) can be implemented with a fuse system that includes one or more fuse cells. A fuse cell is also referred to herein as a fuse. To reduce a cost and/or size of the semiconductor die, it is desirable for the fuse cells to be programmable without needing to use dedicated fuse programming pads. As used herein, pads of an IC can also be referred to as pins or contacts.

In certain implementations herein, a fuse system is programmable using a shared power supply and fuse programming pad. Thus, rather than providing programming using a dedicated fuse programming pad, the pad used for fuse programming is shared with a power supply pad of the semiconductor die. Implementing the fuse system in this manner can provide a number of advantages, such as reduced pin count and/or enhanced quality of power supply distribution by increasing the number of power supply pads that provide power during normal operation.

Although implementing a fuse system with a shared power supply and fuse programming pad provides certain advantages, implementing the fuse system in this manner also exposes the fuse system to power supply transients. For example, the shared power supply and fuse programming pad is connected to a supply voltage during operation of the IC, and thus the fuse system operates with reduced electrical isolation relative to an implementation using a dedicated fuse programming pad.

A shared power supply and fuse programming pad can suffer from power supply transients, such as rapid rising and/or falling edges or glitches. For example, a power supply transients can arise during IC turn-on and/or periods of high chip activity. Moreover, the shared power supply and fuse programming pad can be subjected to electrical overstress, including, but not limited to, electrostatic discharge (ESD) events.

Thus, implementing a fuse system using a shared power supply and fuse programming pad advantageously reduces IC pin count, but also exposes the fuse system to power supply transients. Absent a protection scheme, the power supply transients can lead to inadvertent or accidental programming of fuse cells.

Apparatus and methods for protection against inadvertent programming of fuse cells are provided herein. In certain configurations, a fuse system includes a fuse protection diode, a fuse programming transistor, and a fuse cell electrically connected in series between a first pad (for instance, a power supply pad) and a second pad (for instance, a ground pad). The fuse system further includes a bias generator that biases a gate of the fuse programming transistor to control an amount of current provided to the fuse cell. The fuse protection diode helps prevent inadvertent programming of the fuse cell by blocking current from flowing through the fuse cell in response to a decrease in voltage of the first pad relative to the second pad.

In contrast, a fuse system that omits the fuse protection diode may inadvertently program the fuse cell in response to a transient decrease in the first pad's voltage. For example, in response to a falling voltage edge on the first pad, current can flow from the second pad to the first pad through the fuse cell, and thereby cause accidental programming.

Accordingly, including the fuse protection diode enhances a robustness of the fuse system to voltage transients of the pads. Additionally, the fuse protection diode increases chip yield by reducing the likelihood that a particular semiconductor die is defective due to fuse cells that are incorrectly programmed. Thus, the teachings herein can be used to improve fuse yield and/or reduce field returns.

FIG. 1A is a schematic diagram of one embodiment of a fuse system 20 for a semiconductor die or IC. The fuse system 20 includes a fuse cell or fuse 1, a bias generator or biasing circuit 2, a fuse sensing circuit 3, a fuse programming p-type field-effect transistor (PFET) 11, a first pad 15, a second pad 16, and a fuse protection diode 18. In the illustrated embodiment, the first pad 15 corresponds to a shared power supply and fuse programming pad, and the second pad 16 corresponds to a ground pad.

Although the illustrated fuse system 20 includes one fuse cell, the fuse system 20 can be adapted to include additional fuse cells.

The fuse system 20 is included on a semiconductor die or IC, which includes additional pads and circuitry. For example, the semiconductor die can include a variety of other circuits, such as amplifiers, switches, and/or other circuitry, including, but not limited to, radio frequency circuits.

The bias generator 2 receives a control signal CTL, which is used to instruct the bias generator 2 to selectively program the fuse cell 1. The bias generator 2 is electrically connected to the first pad 15 and the second pad 16 to receive power. As shown in FIG. 1A, the bias generator 2 generates a programming control voltage PRG, which is used to control the gate of the fuse programming PFET 11. In certain configurations, the fuse programming PFET 11 is implemented as a metal oxide semiconductor (MOS) transistor. Although an example with a field-effect transistor is shown, other types of switches can be used for fuse programming. For example, the bias generator 2 can bias a control input to any suitable fuse programming switch to thereby control a current through the fuse cell 1.

The programming control voltage PRG controls an amount of current flowing through the fuse programming PFET 11 and a corresponding current through the fuse cell 1. For example, during a fuse programming operation, the programming control voltage PRG controls the gate of the fuse programming PFET 11 to generate a programming current that is sufficiently large to program the fuse cell 1.

In one specific example, the fuse cell 1 is implemented using a polysilicon fuse that has low resistance prior to programming (when the fuse cell is unblown) and a higher resistance after programming (when the fuse cell is blown). Additionally, the polysilicon fuse is programmed by providing a relatively large current for a sufficient period of time. Although one specific example of fuse cell implementation has been described, the fuse cell 1 can be implemented in a wide variety of ways.

The fuse sensing circuit 3 is used to sense a state of the fuse cell 1 based on detecting the fuse cell's resistivity. In the illustrated embodiment, an input to the fuse sensing circuit 3 is electrically connected to a first terminal of the fuse cell 1. As persons having skill in the art will appreciate, the fuse sensing circuit 3 can be implemented in a wide variety of ways. As shown in FIG. 1A, the fuse sensing circuit 3 generates a data output signal OUT based on reading the state of the fuse cell 1.

Absent a protection scheme, the fuse cell 1 can be accidentally programmed during power supply transients, such as sharp edges of the supply voltage provided to the first pad 15 and/or during an ESD event between the first pad 15 and the second pad 16.

For example, the illustrated fuse system 20 includes the bias generator 2 for controlling programming of the fuse cell 1. However, during certain power supply transients, such as during an ESD event and/or sharp power supply edges, the bias generator 2 can bias the fuse programming PFET 11 to an improper bias level. Absent a protection scheme, a current can flow through the fuse cell 1 and lead to inadvertent programming of the fuse cell 1. The improper transistor biasing can arise from a delay of the bias generator 2 in generating bias voltages, such as the programming control voltage PRG.

As shown in FIG. 1A, the fuse protection diode 18, the fuse programming PFET 11, and the fuse cell 1 are electrically connected in series between the first pad 15 and the second pad 16. As shown in FIG. 1A, an anode of the fuse protection diode 18 is electrically connected to the first pad 15, and a cathode of the fuse protection diode 18 is electrically connected to a source of the fuse programming PFET 11.

Including the fuse protection diode 18 enhances the robustness of the fuse system 20 to inadvertent programming of the fuse cell 1.

For example, in the illustrated embodiment, the first pad 15 corresponds to a shared power supply and fuse programming pad. Implementing the fuse system 20 in this manner advantageously reduces a pad count of a semiconductor die or IC by avoiding a need for a dedicated fuse programming pad.

However, implementing the fuse system 20 in this manner also increases the exposure of the fuse cell 1 to power supply transients, including, but not limited to, ESD events.

For example, a negative polarity ESD event and/or falling power supply edge can cause the voltage of the first pad 15 to decrease relative to the second pad 16. Additionally, the fuse protection diode 18 inhibits the flow of current from ground pad 16 to the shared power supply and fuse programming pad 15, thereby protecting the fuse cell 1 from current that may otherwise inadvertently program the fuse cell 1. Thus, the fuse protection diode 18 serves to cut off a negative edge of the supply voltage.

Figure 1B:
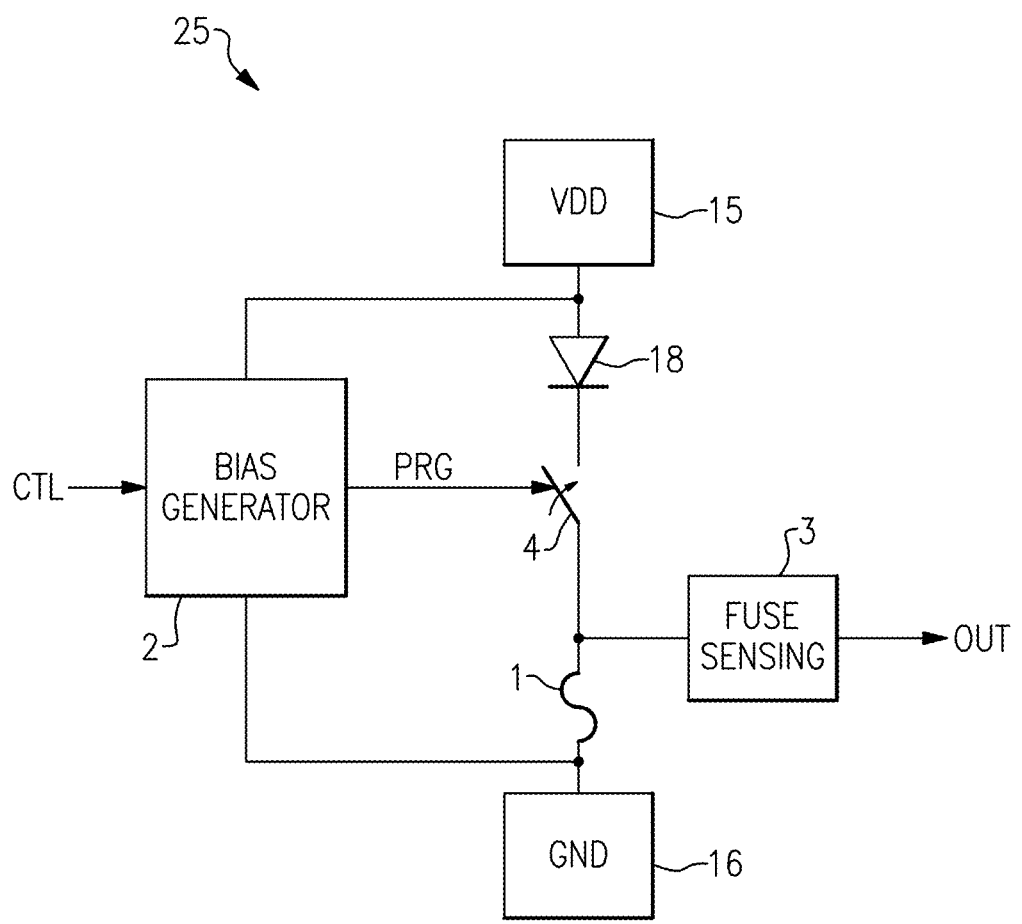
FIG. 1B is a schematic diagram of another embodiment of a fuse system for an IC.

FIG. 1B is a schematic diagram of another embodiment of a fuse system 25 for an IC. The fuse system 25 includes a fuse cell or fuse 1, a biasing circuit 2, a fuse sensing circuit 3, a fuse programming switch 4, a first pad 15, a second pad 16, and a fuse protection diode 18. In the illustrated embodiment, the first pad 15 corresponds to a shared power supply and fuse programming pad, and the second pad 16 corresponds to a ground pad.

The fuse system 25 of FIG. 1B is similar to the fuse system 20 of FIG. 1A, except that the fuse system 25 illustrates an embodiment in which the biasing circuit 2 biases a control input of the fuse programming switch 4 with a fuse programming signal PRG (which can be a voltage and/or current) to thereby control a current through the fuse 1. In certain implementations, the fuse programming switch 4 is a FET, such as a PFET as in the embodiment of FIG. 1A. However, the fuse programming switch 4 can correspond to any switch that is suitable for controlling the current through the fuse 1.

Although various embodiments are depicted herein in the context of FET implementations, the fuse systems herein can be implemented using a wide variety of types of switches, including, but not limited to, voltage-controlled switches.

Figure 2A:
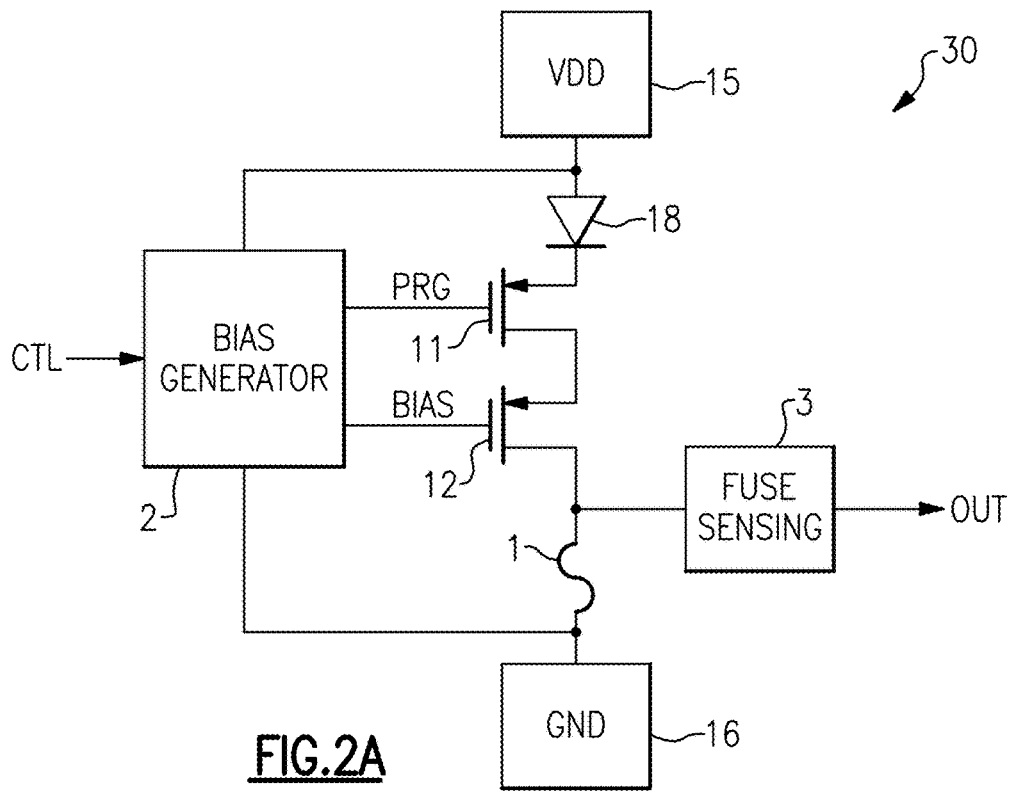
FIG. 2A is a schematic diagram of another embodiment of a fuse system for an IC.

FIG. 2A is a schematic diagram of another embodiment of a fuse system 30 for an IC. The fuse system 30 includes a fuse cell 1, a bias generator 2, a fuse sensing circuit 3, a fuse programming PFET 11, a cascode PFET 12, a first pad 15, a second pad 16, and a fuse protection diode 18.

The fuse system 30 of FIG. 2A is similar to the fuse system 20 of FIG. 1A, except that the fuse system 30 further includes the cascode PFET 12. Additionally, as shown in FIG. 2A, the bias generator 2 generates a cascode bias voltage BIAS for a gate of the cascode PFET 12. In certain configurations, the fuse programming PFET 11 and the cascode PFET 12 are implemented as MOS transistors.

Including the cascode PFET 12 enhances the reliability of the fuse system 30 by preventing the fuse programming PFET 11 from being exposed to overvoltage conditions that can lead to transistor damage and/or breakdown.

For example, the fuse programming PFET 11 may be rated to have a maximum gate-to-drain and/or gate-to-source voltage for a particular process. Including a series combination of two or more FETs can aid in achieving compliance with overstress and/or reliability specifications. Although an example with two transistors in series in shown, the teachings herein are applicable to configurations including more or fewer transistors in series. For example, two or more cascode transistors can be included in series with a fuse programming transistor.

In one implementation, the bias generator 2 controls the cascode bias voltage BIAS based on a voltage difference between the first pad 15 and the second pad 16, for instance, to a voltage level that is about halfway between the voltage of the first pad 15 and the voltage of the second pad 16. However, other implementations are possible.

A delay of the bias generator 2 can lead to inappropriate bias voltage levels of the programming control voltage PRG and/or the cascode bias voltage BIAS in response to a sudden decrease in a voltage of the first pad 15 relative to a voltage of the second pad 16. When the fuse protection diode 18 is omitted, incorrect bias voltage levels can lead to a flow of current that can inadvertently program the fuse cell 1.

By adding the fuse protection diode 18, a reverse current from the second pad 16 to the first pad 15 through the fuse cell 1 can be blocked. However, the fuse protection diode 18 still permits a programming current to flow from the first pad 15 to the second pad 16 through the fuse cell 1 when programming of the fuse cell 1 is desired. Accordingly, the fuse protection diode 18 does not inhibit the flow of a regular programming current.

Figure 2B:
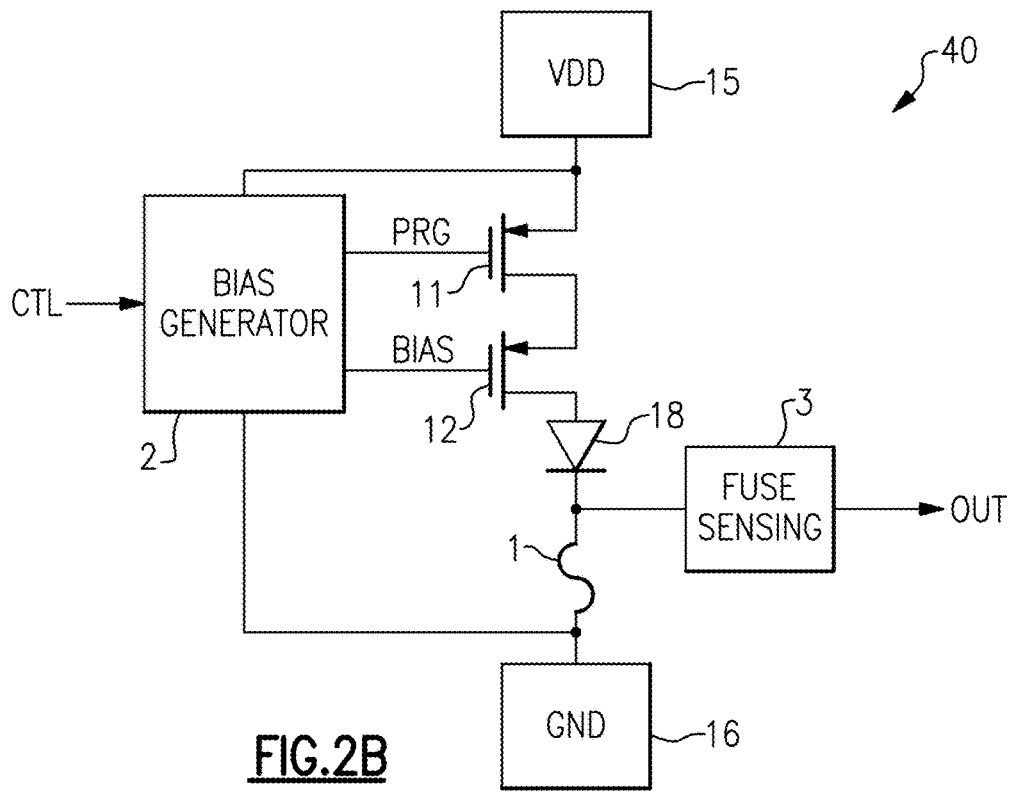
FIG. 2B is a schematic diagram of another embodiment of a fuse system for an IC.

FIG. 2B is a schematic diagram of another embodiment of a fuse system 40 for an IC. The fuse system 40 includes a fuse cell 1, a bias generator 2, a fuse sensing circuit 3, a fuse programming PFET 11, a cascode PFET 12, a first pad 15, a second pad 16, and a fuse protection diode 18.

The fuse system 40 of FIG. 2B is similar to the fuse system 30 of FIG. 2A, except that the fuse system 40 illustrates a different component order in the series combination of the fuse programming PFET 11, the cascode PFET 12, the fuse protection diode 18, and the fuse cell 1. In particular, in contrast to the fuse system 30 of FIG. 2A in which the fuse protection diode 18 is between the first pad 15 and the fuse programming PFET 11, the fuse system 40 of FIG. 2B illustrates an implementation in which the fuse protection diode 18 is between the cascode PFET 12 and the fuse cell 1.

Thus, the fuse protection diode 18 can be positioned in a wide variety of locations along an electrical path between the first pad 15 and the second pad 16. Although two examples are shown, the fuse protection diode 18 can be positioned in any suitable location between the first pad 15 and the second pad 16.

Figure 3:
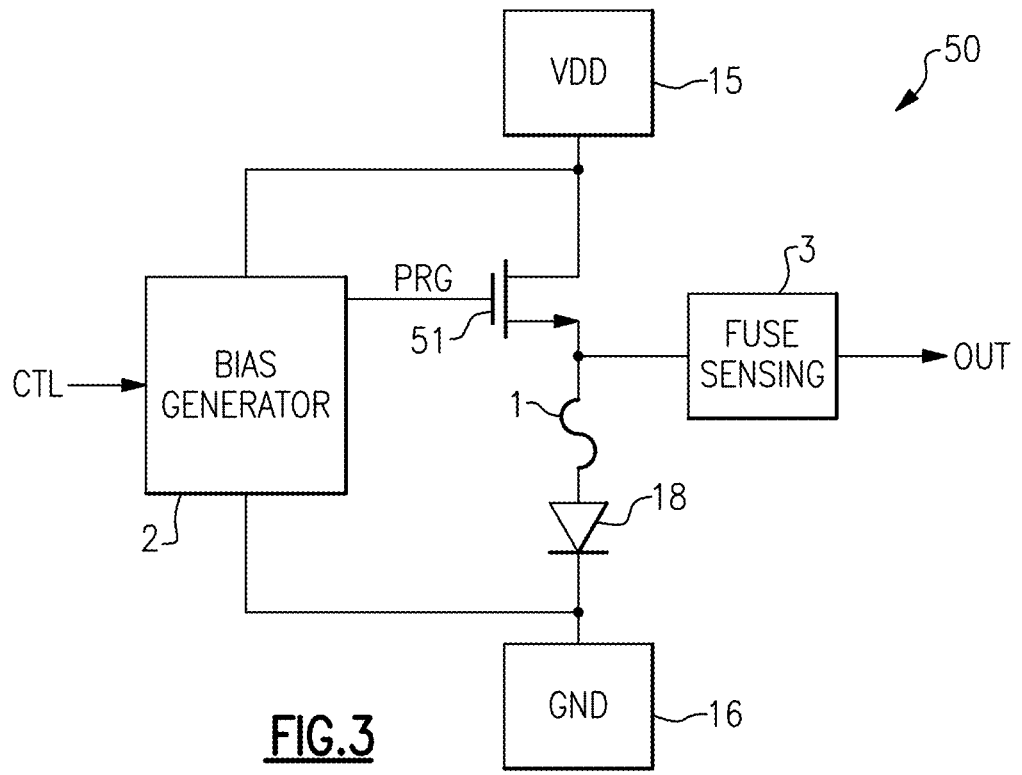
FIG. 3 is a schematic diagram of another embodiment of a fuse system for an IC.

FIG. 3 is a schematic diagram of another embodiment of a fuse system 50 for an IC. The fuse system 50 includes a fuse cell 1, a bias generator 2, a fuse sensing circuit 3, a fuse programming n-type field effect transistor (NFET) 51, a first pad 15, a second pad 16, and a fuse protection diode 18.

The fuse system 50 of FIG. 3 is similar to the fuse system 20 of FIG. 1A, except that the fuse system 50 of FIG. 3 illustrates a complementary implementation using an n-type fuse programming transistor rather than a p-type fuse programming transistor. The fuse systems herein are applicable to a wide variety of configurations of switches for controlling fuse programming, including, but not limited to, implementations using p-type transistors, n-type transistors, or a combination of p-type and n-type transistors.

As shown in FIG. 3, the first pad 15 corresponds to a shared power supply and fuse programming pad, and the second pad 16 corresponds to a ground pad. Additionally, the fuse programming NFET 51, the fuse cell 1, and the fuse protection diode 18 are electrically connected in series between the first pad 15 and the second pad 16. Additionally, the fuse sensing circuit 3 includes an input electrically connected to a first terminal of the fuse cell 1 and to a source of the fuse programming NFET 51. Furthermore, the bias generator 2 is electrically connected between the first pad 15 and the second pad 16 to receive power. As shown in FIG. 3, the bias generator 2 generates a programming control voltage PRG for a gate of the fuse programming NFET 51.

Additional details of the fuse system 50 can be similar to those described earlier.

Figure 4:
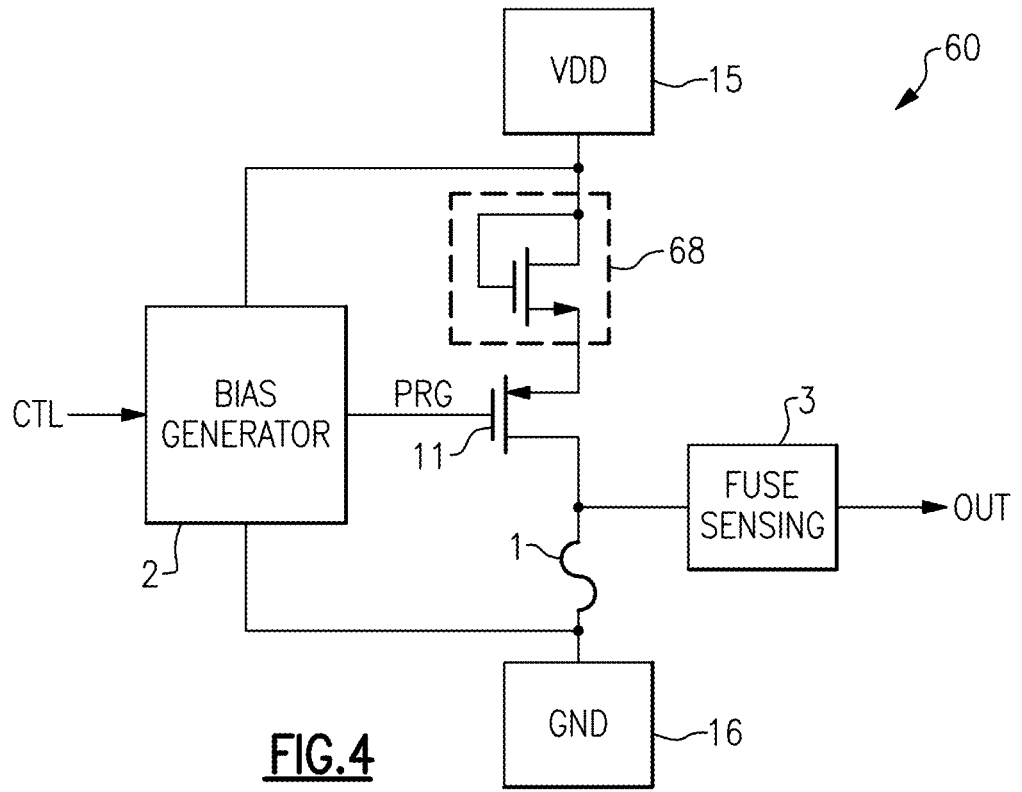
FIG. 4 is a schematic diagram of another embodiment of a fuse system for an IC.

FIG. 4 is a schematic diagram of another embodiment of a fuse system 60 for an IC. The fuse system 60 includes a fuse cell 1, a bias generator 2, a fuse sensing circuit 3, a fuse programming PFET 11, a first pad 15, a second pad 16, and a fuse protection diode-connected NFET 68.

The fuse system 60 of FIG. 4 is similar to the fuse system 20 of FIG. 1A, except that the fuse system 60 of FIG. 4 illustrates an implementation in which the diode 18 is implemented using the diode-connected transistor. The fuse protection diode 18 of FIG. 1A can be implemented in a variety of ways, including, but not limited to, as a p-n junction diode or a diode-connected transistor.

Additional details of the fuse system 60 can be similar to those described earlier.

Figure 5:
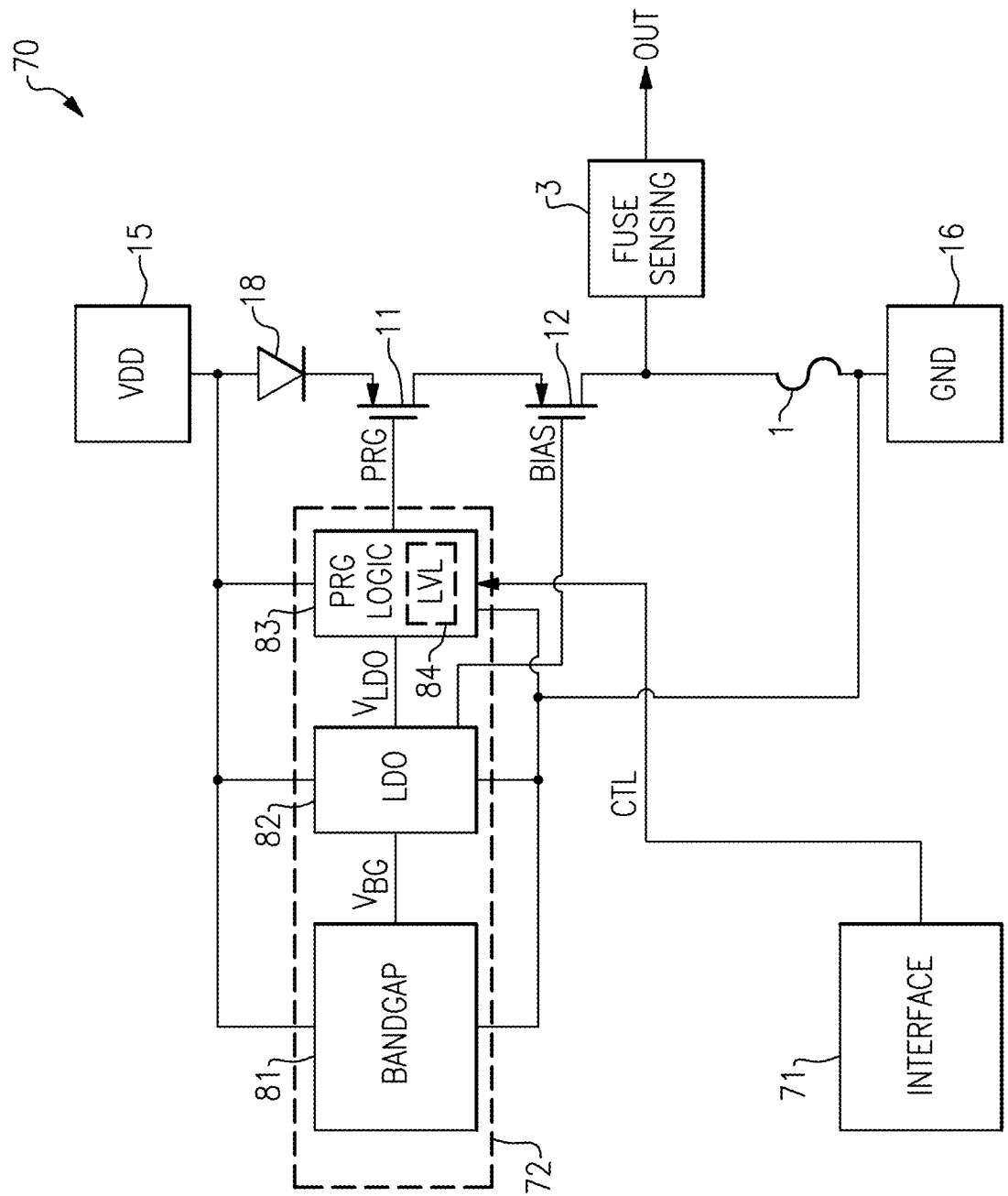
FIG. 5 is a schematic diagram of another embodiment of a fuse system for an IC.

FIG. 5 is a schematic diagram of another embodiment of a fuse system 70 for an IC. The fuse system 70 includes a fuse cell 1, a fuse sensing circuit 3, a fuse programming PFET 11, a cascode PFET 12, a first pad 15, a second pad 16, a fuse protection diode 18, a serial interface 71, and a bias generator 72.

The fuse system 70 of FIG. 5 is similar to the fuse system 30 of FIG. 2A, except that the fuse system 70 illustrates a specific implementation of a bias generator. In particular, the bias generator 72 of FIG. 5 includes a bandgap reference circuit 81, a low dropout (LDO) regulator 82, and a programming logic circuit 83 that includes a level-shifter 84. Additionally, the bias generator 72 of FIG. 5 receives a control signal CTL over the serial interface 71, which can be, for example, a mobile industry processor interface (MIPI) radio frequency front end (RFFE) bus, an inter integrated circuit (I²C) bus, or a serial peripheral interface (SPI) bus.

The bandgap reference circuit 81 is electrically connected between the first pad 15 and the second pad 16 to receive power. The bandgap reference circuit 81 generates a bandgap reference voltage $V_{BG}$, which is substantially independent of temperature. The bandgap reference voltage $V_{BG}$ serves as a reference voltage to the LDO regulator 82, which generates one or more regulated voltages based on the supply voltage received on the first pad 15 and the bandgap reference voltage $V_{BG}$. In the illustrated embodiment, the LDO regulator 82 generates the cascode bias voltage BIAS for the cascode PFET 12 and an LDO voltage $V_{LDO}$ for the level shifter 84 of the programming logic circuit 83.

In certain implementations, the level shifter 84 level shifts the control signal CTL received from the serial interface 71 to generate the fuse programming voltage PRG. In certain implementations, an output of the level shifter 84 is controllable between a high voltage about equal to the power supply voltage received on the first pad 15 and a low voltage about equal to the LDO voltage $V_{LDO}$. The LDO voltage $V_{LDO}$ can be selected based on a variety of factors, for instance to control an amount of current during programming and/or based on a maximum gate-to-source voltage of the fuse programming PFET 11 permitted for a particular process.

During certain power supply transients, such as during an ESD event and/or sharp power supply edges, the bias generator 72 can bias the fuse programming PFET 11 and/or the cascode PFET 12 to an improper bias level. The improper transistor biasing can arise from a delay of the bias generator 72 in generating bias voltages, such as a delay of the LDO regulator 82 in providing voltage regulation.

The fuse protection diode 18 aids in preventing current from flowing through the fuse cell 1 in response to a sudden decrease in the voltage of the first pad 15 relative to the voltage of the second pad 16.

Additional details of the fuse system 70 can be similar to those described earlier.

Figure 6A:
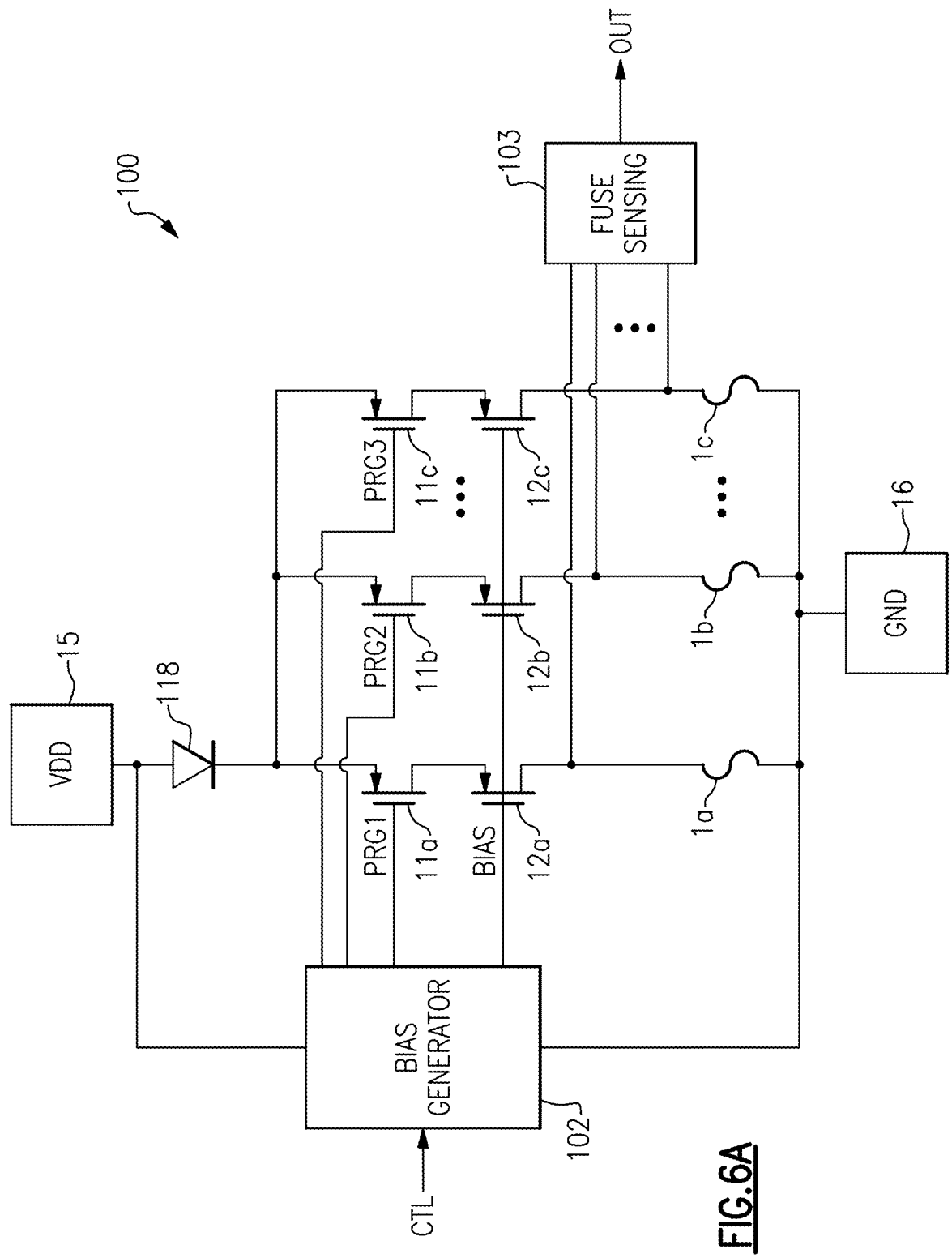
FIG. 6A is a schematic diagram of another embodiment of a fuse system for an IC.

FIG. 6A is a schematic diagram of another embodiment of a fuse system 100 for an IC. The fuse system 100 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, and a shared fuse protection diode 118.

The fuse system 100 of FIG. 6A illustrates one example of a multi-cell fuse system including multiple fuse cells. Although the illustrated fuse system 100 includes three fuse cells, the teachings herein are applicable to configurations including more or fewer fuse cells. Furthermore, although FIG. 6A illustrates an example in which biasing circuitry and fuse sensing circuitry is shared across multiple fuse cells, the teachings herein are applicable to implementations using multiple bias generators and/or multiple fuse sensing circuits.

The bias generator 102 generates a first programming control voltage PRG1 for the gate of the first fuse programming PFET 11a, a second programming control voltage PRG2 for the gate of the second fuse programming PFET 11b, and a third programming control voltage PRG3 for the gate of the third fuse programming PFET 11c. The bias generator 102 further generates a cascode bias voltage BIAS for the gates of the first cascode PFET 12a, the second cascode PFET 12b, and the third cascode PFET 12c. The bias generator 102 also receives a control signal CTL, which instructs programming of the first fuse cell 1a, the second fuse cell 1b, and/or the third fuse cell 1c.

The fuse sensing circuit 103 includes multiple inputs connected to each of the fuse cells 11a-11c. The fuse sensing circuit 103 can be used to read the state of one or more of the fuse cells and to provide output data OUT corresponding to the read data.

The data stored in the fuse cells can correspond to a wide variety of types of data, including, but not limited to, manufacturing identification data and/or data indicating parameters after device fabrication. For example, the fuse cells can include data used to compensate a semiconductor die for variation arising from manufacturing.

As shown in FIG. 6A, the shared fuse protection diode 118, the first fuse programming PFET 11a, the first cascode PFET 12a, and the first fuse cell 1a are connected in series in a first electrical path between the first pad 15 and the second pad 16. Additionally, the shared fuse protection diode 118, the second fuse programming PFET 11b, the second cascode PFET 12b, and the second fuse cell 1b are connected in series in a second electrical path between the first pad 15 and the second pad 16. Furthermore, the shared fuse protection diode 118, the third fuse programming PFET 11c, the third cascode PFET 12c, and the third fuse cell 1c are connected in series in a third electrical path between the first pad 15 and the second pad 16.

Accordingly, the illustrated embodiment uses a shared fuse protection diode 118 to provide protection to multiple fuse cells 11a-11c. Providing protection against accidental programming of fuse cells using a shared or common fuse protection diode 118 reduces a number of components and provides a compact layout.

Figure 6B:
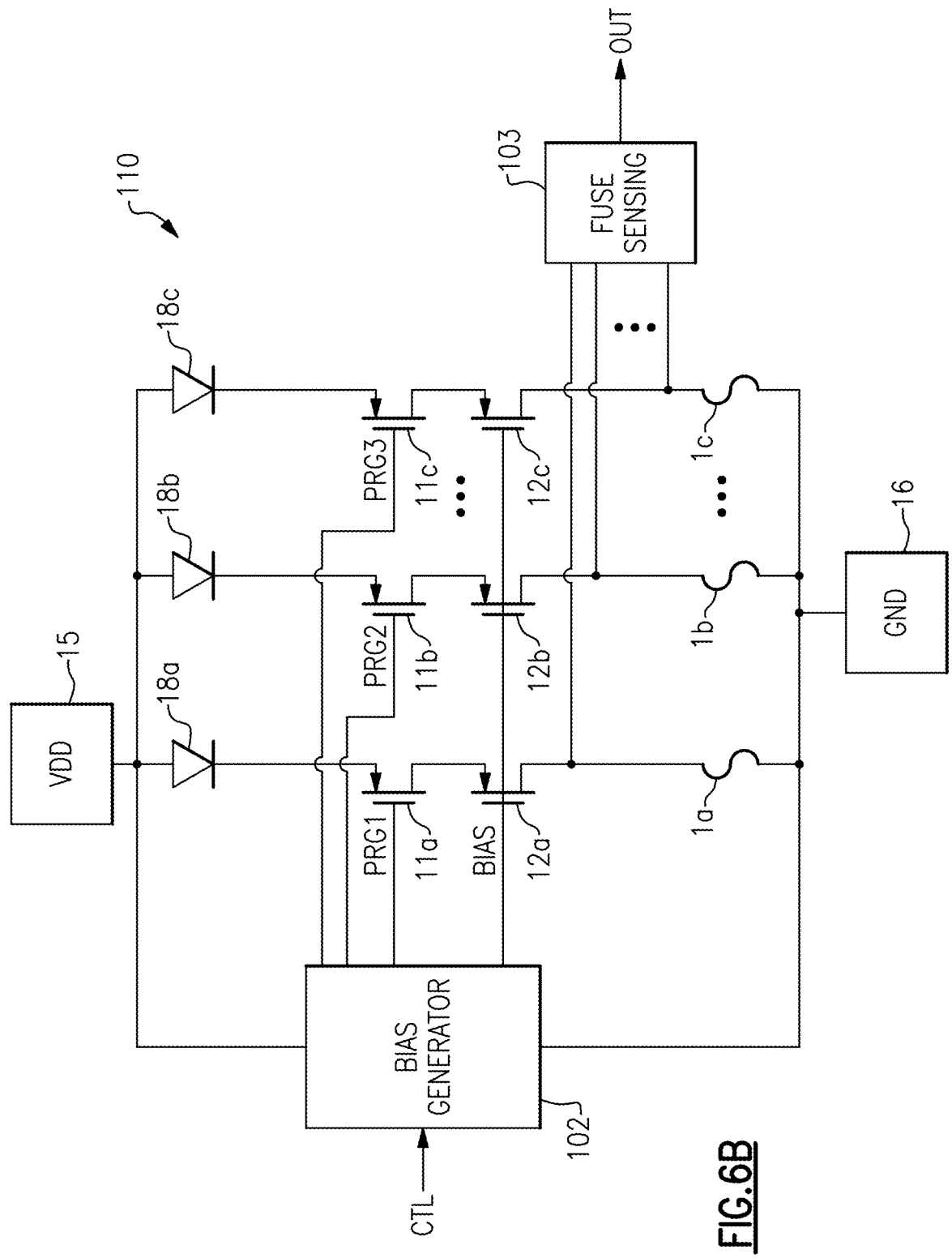
FIG. 6B is a schematic diagram of another embodiment of a fuse system for an IC.

FIG. 6B is a schematic diagram of another embodiment of a fuse system 110 for an IC. The fuse system 110 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, a first fuse protection diode 18a, a second fuse protection diode 18b, and a third fuse protection diode 18c.

The fuse system 110 of FIG. 6B is similar to the fuse system 100 of FIG. 6A, except that the fuse system 110 of FIG. 6B includes separate fuse protection diodes for each fuse cell.

Examples of Fuse Systems with a Fuse Protection Capacitor

Apparatus and methods for protection against inadvertent programming of fuse cells are provided herein. In certain configurations, a fuse system includes a fuse programming transistor, a cascode transistor, and a fuse cell electrically connected in series between a first pad (for instance, a power supply pad) and a second pad (for instance, a ground pad). The fuse system further includes a bias generator that controls an amount of current provided to the fuse cell based on biasing a gate of the fuse programming transistor and a gate of the cascode transistor. The fuse system further includes a fuse protection capacitor electrically connected between the first pad and the gate of the cascode transistor to prevent inadvertent programming of the fuse cell in response to an increase in voltage of the first pad relative to the second pad.

In contrast, a fuse system that omits the fuse protection capacitor may inadvertently program the fuse cell in response to a transient increase in voltage of the first pad. For example, in response to a rising voltage edge on the first pad, current can flow from the first pad to the second pad through the fuse cell, and thereby cause accidental programming.

Accordingly, including the fuse protection capacitor enhances a robustness of the fuse system to voltage transients of the pads. Additionally, the fuse protection capacitor increases chip yield by reducing the likelihood that a particular semiconductor die is defective due to fuse cells that are incorrectly programmed. Thus, the teachings herein can be used to improve fuse yield and/or reduce field returns.

Figure 7:
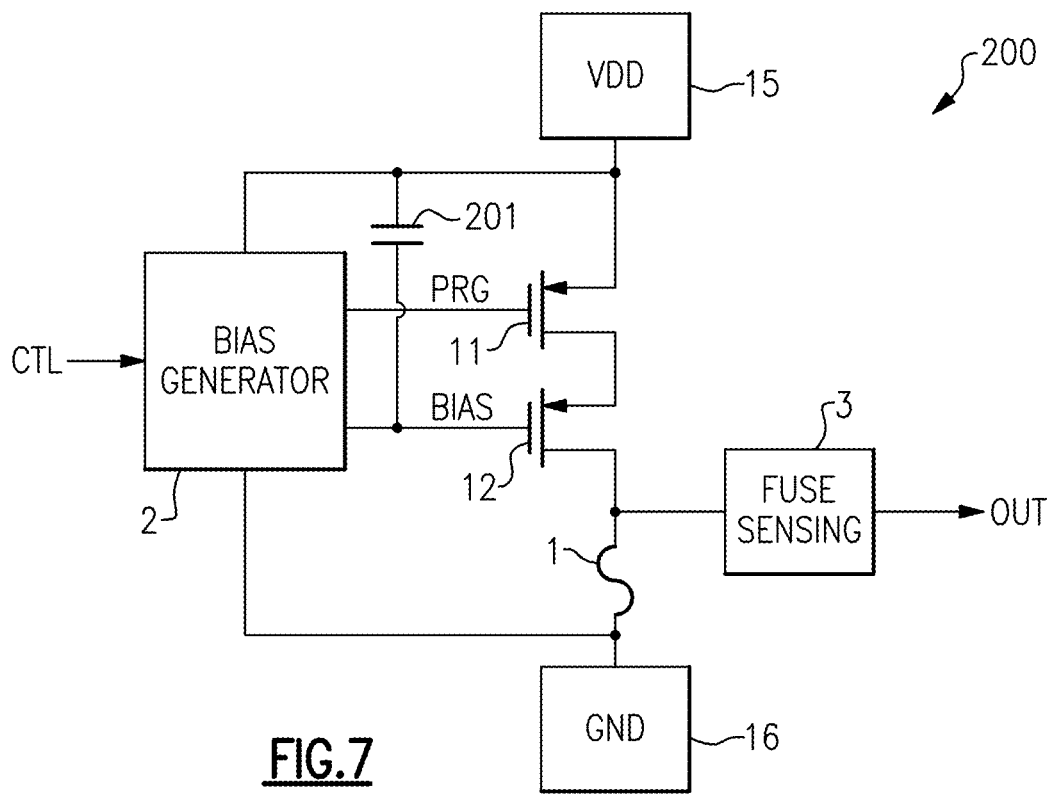
FIG. 7 is a schematic diagram of another embodiment of a fuse system for an IC.

FIG. 7 is a schematic diagram of another embodiment of a fuse system 200 for an IC. The fuse system 200 includes a fuse cell 1, a bias generator 2, a fuse sensing circuit 3, a fuse programming PFET 11, a cascode PFET 12, a first pad 15, a second pad 16, and a fuse protection capacitor 201. In the illustrated embodiment, the first pad 15 corresponds to a shared power supply and fuse programming pad, and the second pad 16 corresponds to a ground pad.

Although the illustrated fuse system 200 includes one fuse cell, the fuse system 20 can be adapted to include additional fuse cells.

As shown in FIG. 7, the fuse programming PFET 11, the cascode PFET 12, and the fuse cell 1 are electrically connected in series between the first pad 15 and the second pad 16. Including the cascode PFET 12 enhances the reliability of the fuse system 200 by preventing the fuse programming PFET 11 from being exposed to overvoltage conditions that can lead to transistor damage and/or breakdown.

For example, the illustrated FETs may be rated to have a maximum gate-to-drain and/or gate-to-source voltage for a particular process. Including a series combination of two or more FETs can aid in achieving compliance with overstress and/or reliability specifications. Although an example with two transistors in series in shown, the teachings herein are applicable to configurations including more or fewer transistors in series. For example, two or more cascode transistors can be included in series with a fuse programming transistor.

The bias generator 2 receives a control signal CTL, which is used to instruct the bias generator 2 to program the fuse cell 1. The bias generator 2 is electrically connected to the first pad 15 and the second pad 16 to receive power. As shown in FIG. 7, the bias generator 2 generates a programming control voltage PRG, which is used to control the gate of the fuse programming PFET 11. Additionally, the bias generator 2 generates a cascode bias voltage BIAS, which is used to control the gate of the cascode PFET 12. In certain configurations, the fuse programming PFET 11 and the cascode PFET 12 are implemented as MOS transistors.

The programming control voltage PRG controls an amount of current flowing through the fuse programming PFET 11 and the cascode PFET 12, and a corresponding current through the fuse cell 1. For example, during a fuse programming operation, the programming control voltage PRG controls the gate of the fuse programming PFET 11 to generate a programming current that is sufficiently large to program the fuse cell 1.

The fuse sensing circuit 3 is used to sense a state of the fuse cell 1 based on detecting the fuse cell's resistivity. In the illustrated embodiment, an input to the fuse sensing circuit 3 is electrically connected to a first terminal of the fuse cell 1. As shown in FIG. 7, the fuse sensing circuit 3 generates a data output signal OUT based on reading the state of the fuse cell 1.

Absent a protection scheme, the fuse cell 1 can be accidentally programmed during power supply transients, such as sharp edges of the supply voltage provided to the first pad 15 and/or during an ESD event between the first pad 15 and the second pad 16.

For example, the illustrated fuse system 200 includes the bias generator 2 for controlling programming of the fuse cell 1. However, during certain power supply transients, such as during an ESD event and/or sharp power supply edges, the bias generator 2 can bias the fuse programming PFET 11 and/or the cascode PFET 12 to an improper bias level. Absent a protection scheme, a current can flow through the fuse cell 1 and lead to inadvertent programming of the fuse cell 1. The improper transistor biasing can arise from a delay of the bias generator 2 in generating bias voltages, such as the programming control voltage PRG and the cascode bias voltage BIAS.

As shown in FIG. 7, the fuse protection capacitor 201 is used to provide coupling to the gate of the cascode PFET 12. Including the fuse protection capacitor 201 compensates for a delay of the bias generator 2 in controlling the voltage level of the cascode bias voltage BIAS. For example, the fuse protection capacitor 201 provides coupling from the shared power supply and fuse programming pad 15 to the gate of the cascode PFET 12, thereby helping to maintain the cascode PFET 12 turned off in response to a rising edge of the supply voltage.

The fuse protection capacitor 201 serves to increase the gate voltage of the cascode PFET 12 in response to a rising edge of the supply voltage received at the first pad 15. Thus, the gate voltage of the cascode PFET 12 rises in response to a sharp edge of the supply voltage, and thus serves to delay or cut off a current path through the fuse cell 1.

As persons of ordinary skill in the art will appreciate, the impedance of the fuse protection capacitor 201 is frequency dependent, and the fuse protection capacitor 201 passes high frequency signal components while blocking low frequency signal components. For instance, the fuse protection capacitor 201 can behave as a short circuit in response to a voltage signal having a frequency above a high frequency threshold and as an open circuit in response to a voltage signal having a frequency below a low frequency threshold. The high and low frequency thresholds are dependent, in part, on the capacitance value of the fuse protection capacitor 201. In certain implementations, a capacitance value of the fuse protection capacitor 201 is selected such that the fuse protection capacitor 201 behaves as a short circuit in response to high-frequency events, such as ESD events and/or sharp power supply edges, and otherwise behaves as an open circuit.

Accordingly, including the fuse protection capacitor reduces the likelihood that the fuse cell 1 is accidentally programmed or burnt in response to increase in the voltage of the first pad 15 relative to the second pad 16.

In contrast, when the fuse protection capacitor 201 is omitted, the fuse cell 1 may be inadvertently programmed in response to a sudden increase in the voltage of the first pad 15. For example, after the voltage of the first pad 15 increases, a delay of the bias generator 2 can result in the programming control voltage PRG and/or the cascode bias voltage BIAS may still have a relatively low voltage. Additionally, the bias voltage levels can lead to the presence of a conductive path through which a relatively large current (for instance, a large ESD current) can flow.

Thus, a fuse cell can be programmed (for instance, burnt) by accident during ESD or other sharp voltage edges on the supply voltage VDD. By including the fuse protection capacitor 201, the likelihood of accidental programming of the fuse cell 1 can be reduced.

The fuse protection capacitor 201 corresponds to an explicit capacitor, rather than mere parasitic capacitance. In one embodiment, the fuse protection capacitor 201 has a capacitance of at least 1 pF.

Figure 8:
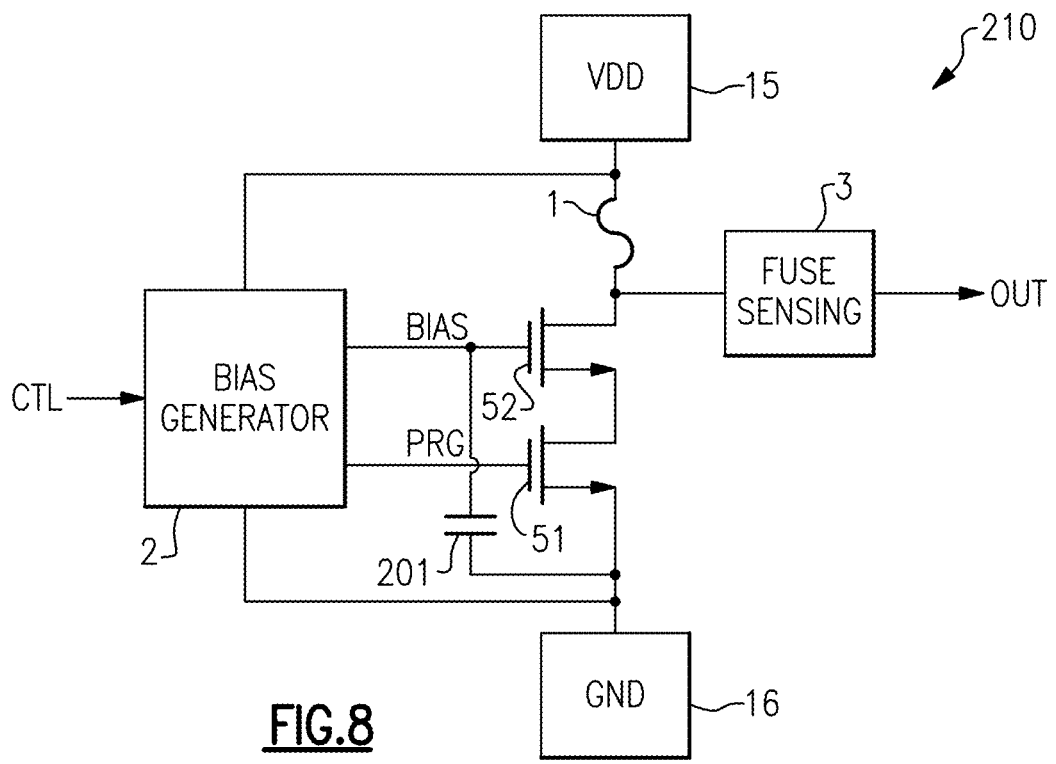
FIG. 8 is a schematic diagram of another embodiment of a fuse system for an IC.

FIG. 8 is a schematic diagram of another embodiment of a fuse system 210 for an IC. The fuse system 210 includes a fuse cell 1, a bias generator 2, a fuse sensing circuit 3, a fuse programming NFET 51, a cascode NFET 52, a first pad 15, a second pad 16, and a fuse protection capacitor 201.

The fuse system 210 of FIG. 8 is similar to the fuse system 200 of FIG. 7, except that the fuse system 210 of FIG. 8 illustrates a complementary implementation using an n-type transistors rather than p-type transistors. The fuse systems herein are applicable to a wide variety of configurations, including implementations using p-type transistors, n-type transistors, or a combination of p-type and n-type transistors.

As shown in FIG. 8, the fuse cell 1, the cascode NFET 52, and the fuse programming NFET 51 are electrically connected in series between the first pad 15 and the second pad 16. Additionally, the fuse sensing circuit 3 includes an input electrically connected to a first terminal of the fuse cell 1. Furthermore, the bias generator 2 is electrically connected between the first pad 15 and the second pad 16 to receive power. As shown in FIG. 8, the bias generator 2 generates a programming control voltage PRG for a gate of the fuse programming NFET 51 and a cascode bias voltage BIAS for the cascode NFET 52.

As shown in FIG. 8, the fuse protection capacitor 201 is electrically connected between the gate of the cascode NFET 52 and the ground pad 16. Thus, in response to a sudden decrease of the voltage of the ground pad 16 (for instance, during a negative polarity ESD event), the gate voltage of the cascode NFET 52 is coupled downward to inhibit undesired current from flowing through the fuse cell 1.

Additional details of the fuse system 210 can be similar to those described earlier.

Figure 9:
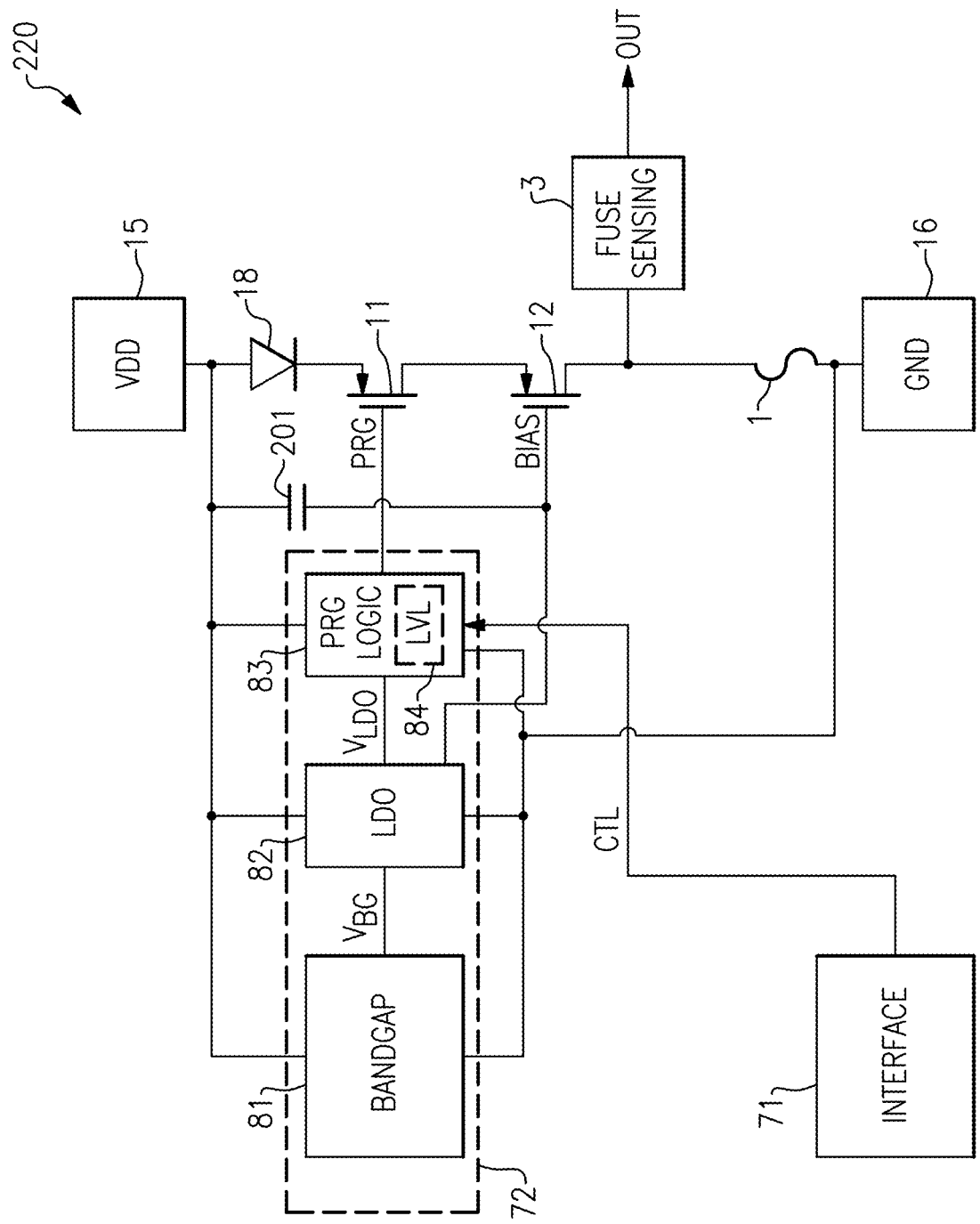
FIG. 9 is a schematic diagram of another embodiment of a fuse system for an IC.

FIG. 9 is a schematic diagram of another embodiment of a fuse system 220 for an IC. The fuse system 220 includes a fuse cell 1, a fuse sensing circuit 3, a fuse programming PFET 11, a cascode PFET 12, a first pad 15, a second pad 16, a serial interface 71, a bias generator 72, and a fuse protection capacitor 201.

The fuse system 220 of FIG. 9 is similar to the fuse system 200 of FIG. 7, except that the fuse system 220 of FIG. 9 illustrates a specific implementation of a bias generator. In particular, the bias generator 72 of FIG. 9 includes a bandgap reference circuit 81, an LDO regulator 82, and a programming logic circuit 83 that includes a level-shifter 84. Additionally, the bias generator 72 of FIG. 9 receives a control signal CTL over the serial interface 71.

During certain power supply transients, such as during an ESD event and/or sharp power supply edges, the bias generator 72 can bias the fuse programming PFET 11 and/or the cascode PFET 12 to an improper bias level. The improper transistor biasing can arise from a delay of the bias generator 72 in generating bias voltages, such as a delay of the LDO regulator 82 in providing voltage regulation. Accordingly, after a change in voltage of the first pad 15, the bias voltage levels of the programming control voltage PRG and/or the cascode bias voltage BIAS can temporarily operate with incorrect voltage levels. This in turn can expose the fuse cell 1 to a programming current that can cause accidental fuse programming.

The fuse protection capacitor 201 aids in preventing current from flowing through the fuse cell 1 in response to a sudden increase in the voltage of the first pad 15. In particular, the fuse protection capacitor 201 serves to increase the gate voltage of the cascode PFET 12 in response to a rising edge of the supply voltage received at the first pad 15. Thus, the gate voltage of the cascode PFET 12 rises in response to a sharp edge of the supply voltage, and thus delays or cut offs a current path through the fuse cell 1.

Accordingly, including the fuse protection capacitor 201 reduces the likelihood that the fuse cell 1 is accidentally programmed or burnt in response to increase in the voltage of the first pad 15 relative to the second pad 16.

Additional details of the fuse system 220 can be similar to those described earlier.

Figure 10A:
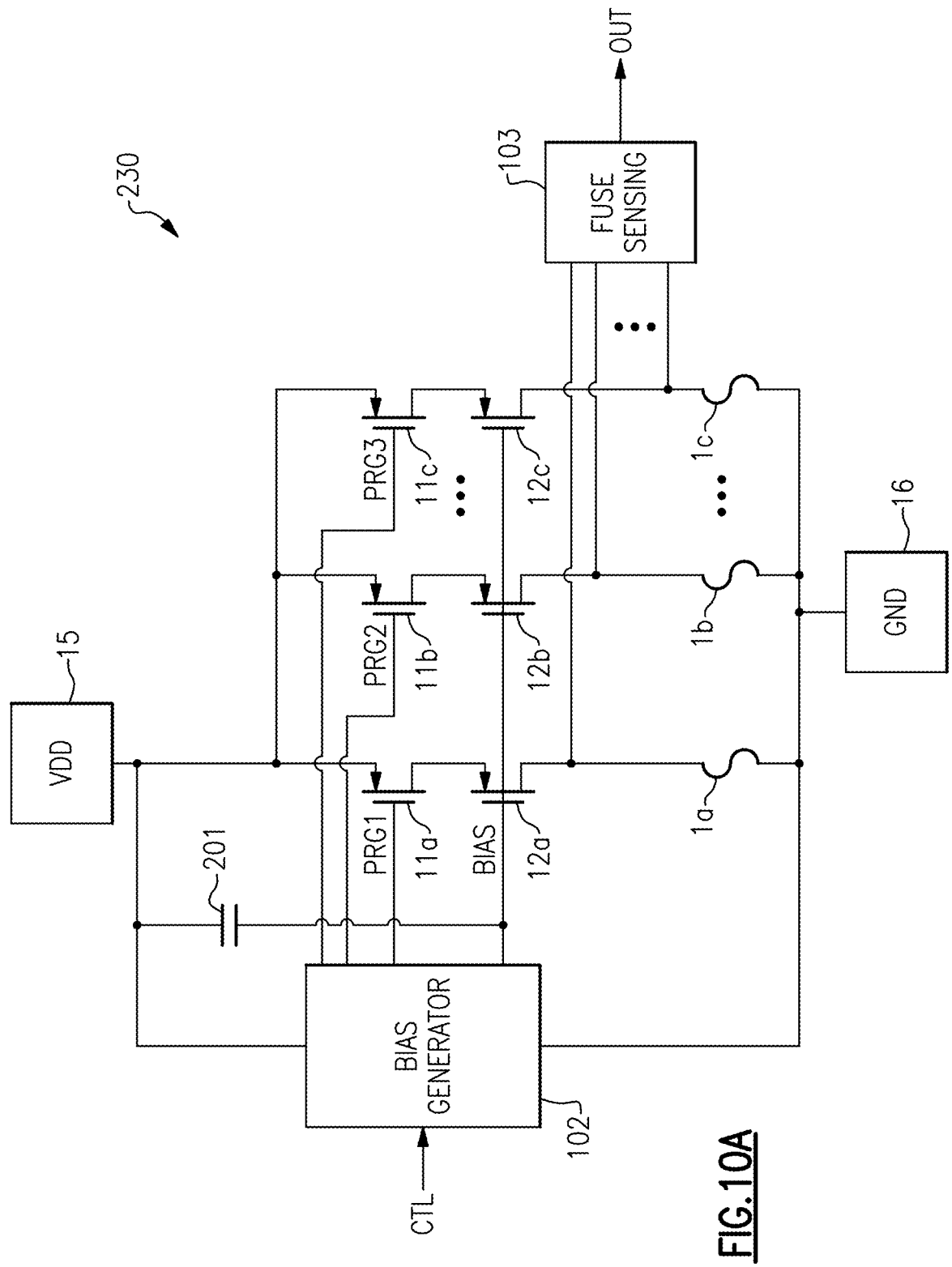
FIG. 10A is a schematic diagram of another embodiment of a fuse system for an IC.

FIG. 10A is a schematic diagram of another embodiment of a fuse system 230 for an IC. The fuse system 230 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, and a shared fuse protection capacitor 201.

The fuse system 230 of FIG. 10A illustrates one example of a multi-cell fuse system including multiple fuse cells. Although the illustrated fuse system 230 of FIG. 10A includes three fuse cells, the teachings herein are applicable to configurations including more or fewer fuse cells.

As shown in FIG. 10A, the first fuse programming PFET 11a, the first cascode PFET 12a, and the first fuse cell 1a are connected in series in a first electrical path between the first pad 15 and the second pad 16. Additionally, the second fuse programming PFET 11b, the second cascode PFET 12b, and the second fuse cell 1b are connected in series in a second electrical path between the first pad 15 and the second pad 16. Furthermore, the third fuse programming PFET 11c, the third cascode PFET 12c, and the third fuse cell 1c are connected in series in a third electrical path between the first pad 15 and the second pad 16.

The fuse sensing circuit 103 includes multiple inputs connected to each of the fuse cells 11a-11c. The fuse sensing circuit 103 can be used to read the state of one or more of the fuse cells and to provide output data OUT corresponding to the read data.

The bias generator 102 generates a first programming control voltage PRG1 for the gate of the first fuse programming PFET 11a, a second programming control voltage PRG2 for the gate of the second fuse programming PFET 11b, and a third programming control voltage PRG3 for the gate of the third fuse programming PFET 11c. The bias generator 102 also receives a control signal CTL, which instructs programming of the first fuse cell 1a, the second fuse cell 1b, and/or the third fuse cell 1c. The bias generator 102 further generates a cascode bias voltage BIAS for the first cascode PFET 12a, the second cascode PFET 12b, and the third cascode PFET 12c.

As shown in FIG. 10A, the shared fuse protection capacitor 201 is electrically connected between the cascode bias voltage BIAS and the first pad 15. Accordingly, the illustrated embodiment uses a shared fuse protection capacitor 201 to provide protection to multiple fuse cells 11a-11c. Providing protection against accidental programming of fuse cells using a shared or common fuse protection capacitor 201 reduces a number of components and provides a compact layout.

Figure 10B:
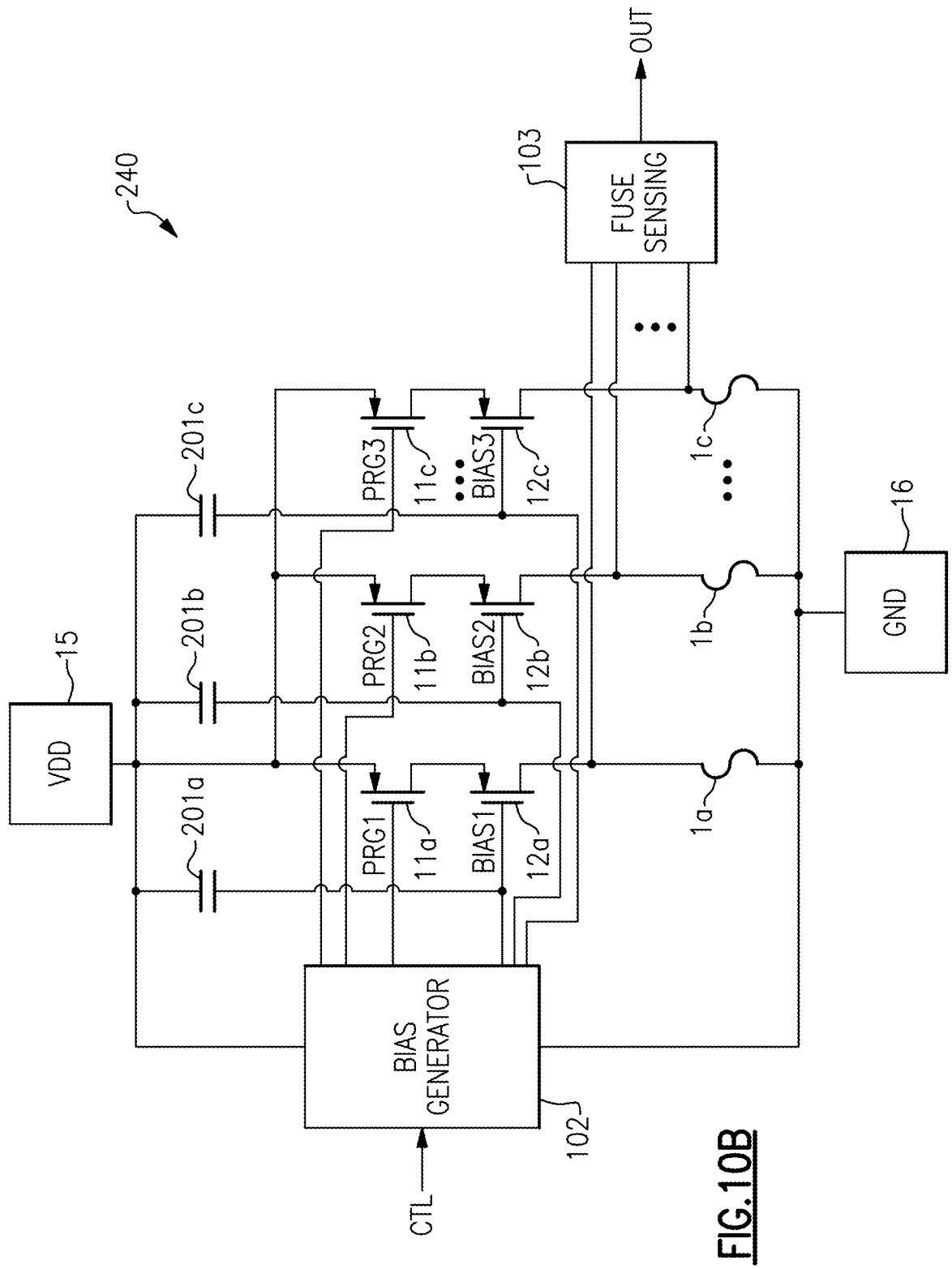
FIG. 10B is a schematic diagram of another embodiment of a fuse system for an IC.

FIG. 10B is a schematic diagram of another embodiment of a fuse system 240 for an IC. The fuse system 240 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, a first fuse protection capacitor 201a, a second fuse protection capacitor 201b, and a third fuse protection capacitor 201c.

The fuse system 240 of FIG. 10B is similar to the fuse system 230 of FIG. 10A, except that the fuse system 240 of FIG. 10B includes separate fuse protection capacitors for each fuse cell.

For example, the bias generator 102 generates a first cascode bias voltage BIAS1 for the first cascode PFET 12a, a second cascode bias voltage BIAS 2 for the second cascode PFET 12b, and a third cascode bias voltage BIAS3 for the third cascode PFET 12c. Additionally, the first fuse protection capacitor 201a is connected between the first cascode bias voltage BIAS1 and the first pad 15, the second fuse protection capacitor 201b is connected between the second cascode bias voltage BIAS2 and the first pad 15, and the third fuse protection capacitor 201c is connected between the third cascode bias voltage BIAS3 and the first pad 15.

Examples of Fuse Systems with a Fuse Protection Diode and a Fuse Protection Capacitor A programmable fuse system can include a combination of a fuse protection diode and a fuse protection capacitor. Implementing a programmable fuse system in this manner can provide enhanced resilience to inadvertent fuse programming in the presence of a wide range of power supply transients, including, but not limited to positive and negative polarity ESD events and/or rising and falling power supply edges.

Although various embodiments of fuse systems including a combination of a fuse protection diode and a fuse protection capacitor are illustrated, the teachings herein are applicable to a wide variety of configurations. For example, although the fuse protection systems of FIGS. 7-10B are illustrated with a fuse protection capacitor but without a fuse protection diode, any of the fuse protection systems of FIGS. 7-10B can also include a fuse protection diode. Likewise, although the fuse protection systems of FIGS. 1-6B are illustrated with a fuse protection diode but without a fuse protection capacitor, any of the fuse protection systems of FIGS. 7-10B can also include a fuse protection capacitor.

Figure 11A:
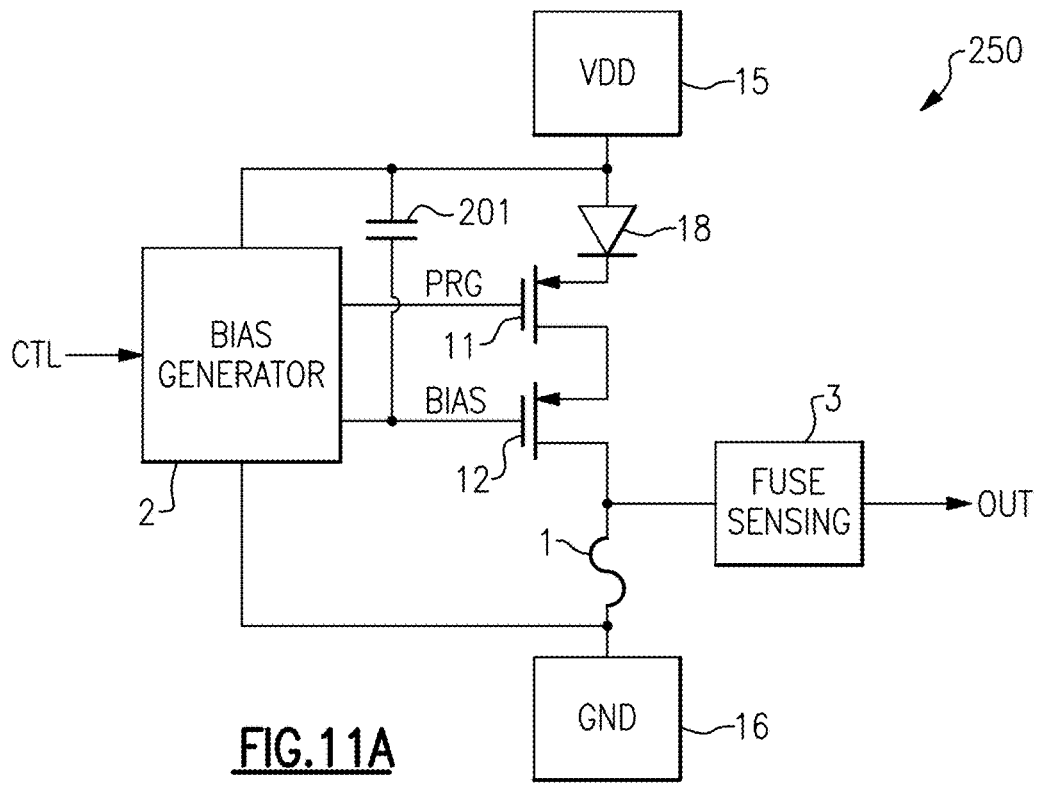
FIG. 11A is a schematic diagram of another embodiment of a fuse system for an IC.

FIG. 11A is a schematic diagram of another embodiment of a fuse system 250 for an IC. The illustrated fuse system 250 includes a fuse cell 1, a bias generator 2, a fuse sensing circuit 3, a fuse programming PFET 11, a cascode PFET 12, a shared power supply and fuse programming pad 15, a ground pad 16, a fuse protection diode 18, and a fuse protection capacitor 201. In the illustrated embodiment, the fuse protection diode 18, the fuse programming PFET 11, the cascade PFET 12, and the fuse cell 1 are electrically connected in series between the shared power supply and fuse programming pad 15 and the ground pad 16. Additionally, the fuse protection capacitor 201 is electrically connected between the gate of the cascode PFET 12 and the shared power supply and fuse programming pad 15.

The fuse system 250 of FIG. 11A illustrates one example of a fuse system 250 including a combination of a fuse protection diode and a fuse protection capacitor. Additional details of the fuse system 250 can be similar to those described earlier.

Figure 11B:
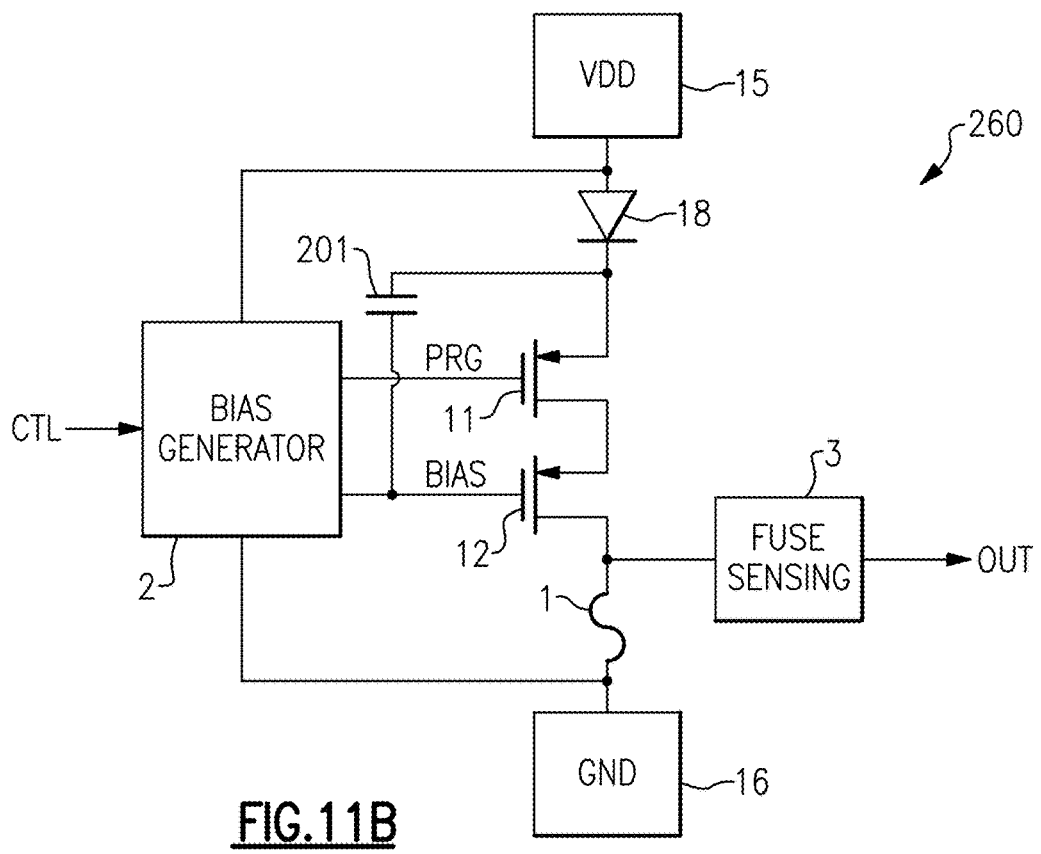
FIG. 11B is a schematic diagram of another embodiment of a fuse system for an IC.

FIG. 11B is a schematic diagram of another embodiment of a fuse system 260 for an IC. The illustrated fuse system 260 includes a fuse cell 1, a bias generator 2, a fuse sensing circuit 3, a fuse programming PFET 11, a cascode PFET 12, a shared power supply and fuse programming pad 15, a ground pad 16, a fuse protection diode 18, and a fuse protection capacitor 201.

The fuse system 260 of FIG. 11B is similar to the fuse system 250 of FIG. 11A, except that FIG. 11B illustrates a configuration with different connectivity for the fuse protection capacitor 201. In particular, in contrast to the fuse system 250 of FIG. 11A in which the fuse protection capacitor 201 is directly connected to the shared power supply and fuse programming pad 15, the fuse system 260 of FIG. 11B illustrates a configuration in which the fuse protection capacitor 201 is electrically connected to the shared power supply and fuse programming pad 15 via the fuse protection diode 18.

The fuse system 260 of FIG. 11B illustrates another example of a fuse system including a combination of a fuse protection diode and a fuse protection capacitor. Additional details of the fuse system 260 can be similar to those described earlier.

Figure 11C:
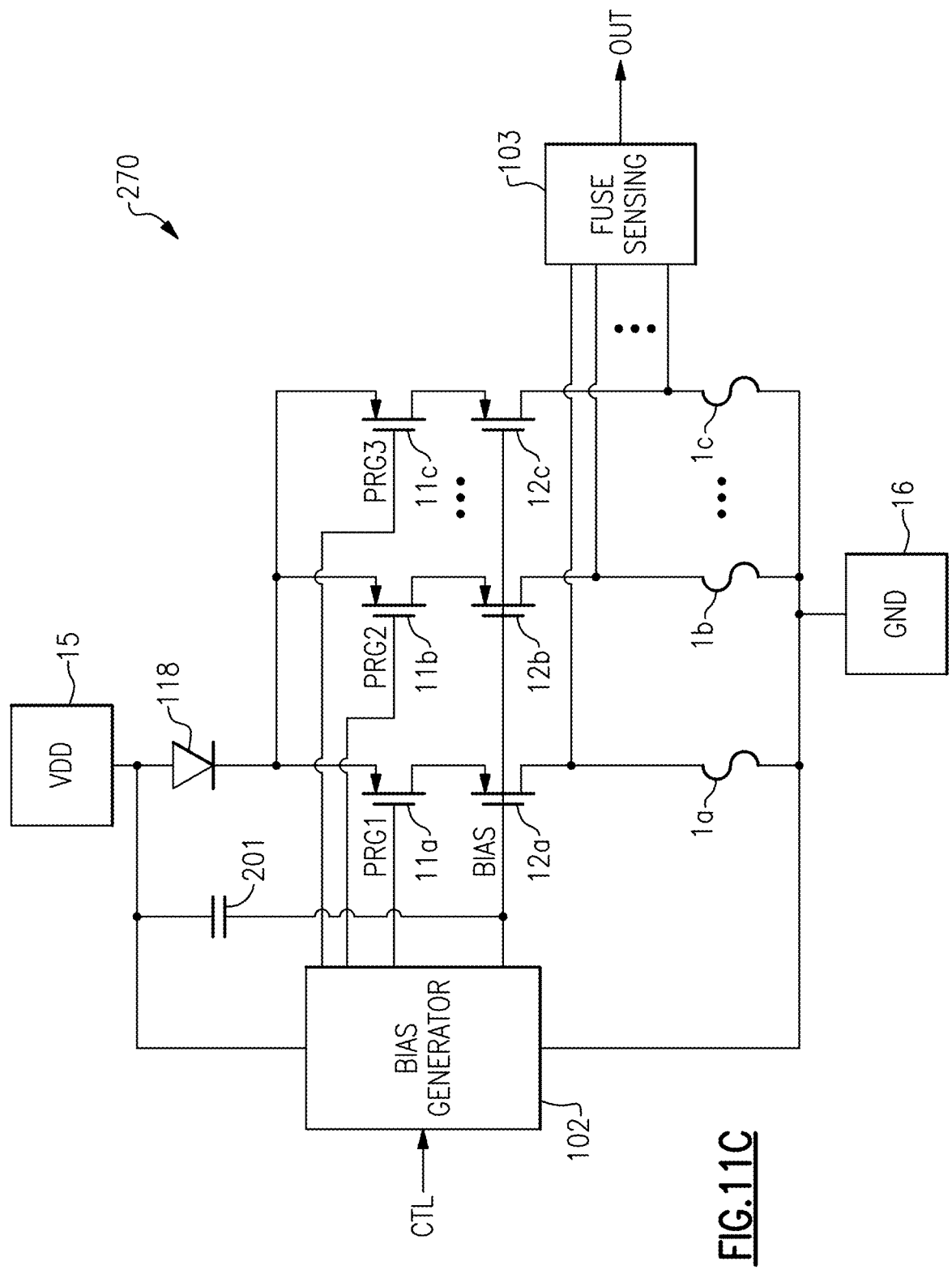
FIG. 11C is a schematic diagram of another embodiment of a fuse system for an IC.

FIG. 11C is a schematic diagram of another embodiment of a fuse system 270 for an IC. The fuse system 270 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, a shared fuse protection diode 118, and a shared fuse protection capacitor 201.

The fuse system 270 of FIG. 11C illustrates one example of a multi-cell fuse system including multiple fuse cells. Although the illustrated fuse system 270 includes three fuse cells, the teachings herein are applicable to configurations including more or fewer fuse cells. Furthermore, although FIG. 11C illustrates an example in which biasing circuitry and fuse sensing circuitry is shared across multiple fuse cells, the teachings herein are applicable to implementations using multiple bias generators and/or multiple fuse sensing circuits.

The bias generator 102 generates a first programming control voltage PRG1 for the gate of the first fuse programming PFET 11a, a second programming control voltage PRG2 for the gate of the second fuse programming PFET 11b, and a third programming control voltage PRG3 for the gate of the third fuse programming PFET 11c. The bias generator 102 further generates a cascode bias voltage BIAS for the gates of the first cascode PFET 12a, the second cascode PFET 12b, and the third cascode PFET 12c. The bias generator 102 also receives a control signal CTL, which instructs programming of the first fuse cell 1a, the second fuse cell 1b, and/or the third fuse cell 1c.

The fuse sensing circuit 103 includes multiple inputs connected to each of the fuse cells 11a-11c. The fuse sensing circuit 103 can be used to read the state of one or more of the fuse cells and to provide output data OUT corresponding to the read data.

As shown in FIG. 11C, the shared fuse protection diode 118, the first fuse programming PFET 11a, the first cascode PFET 12a, and the first fuse cell 1a are connected in series in a first electrical path between the first pad 15 and the second pad 16. Additionally, the shared fuse protection diode 118, the second fuse programming PFET 11b, the second cascode PFET 12b, and the second fuse cell 1b are connected in series in a second electrical path between the first pad 15 and the second pad 16. Furthermore, the shared fuse protection diode 118, the third fuse programming PFET 11c, the third cascode PFET 12c, and the third fuse cell 1c are connected in series in a third electrical path between the first pad 15 and the second pad 16.

Accordingly, the illustrated embodiment uses a shared fuse protection diode 118 to provide protection to multiple fuse cells 11a-11c. Providing protection against accidental programming of fuse cells using a shared or common fuse protection diode 118 reduces a number of components and provides a compact layout.

Furthermore, as shown in FIG. 11C, the shared fuse protection capacitor 201 is electrically connected between the cascode bias voltage BIAS and the first pad 15. Accordingly, the illustrated embodiment uses a shared fuse protection capacitor 201 to provide protection to multiple fuse cells 11a-11c. Providing protection against accidental programming of fuse cells using a shared or common fuse protection capacitor 201 reduces a number of components and provides a compact layout.

Figure 11D:
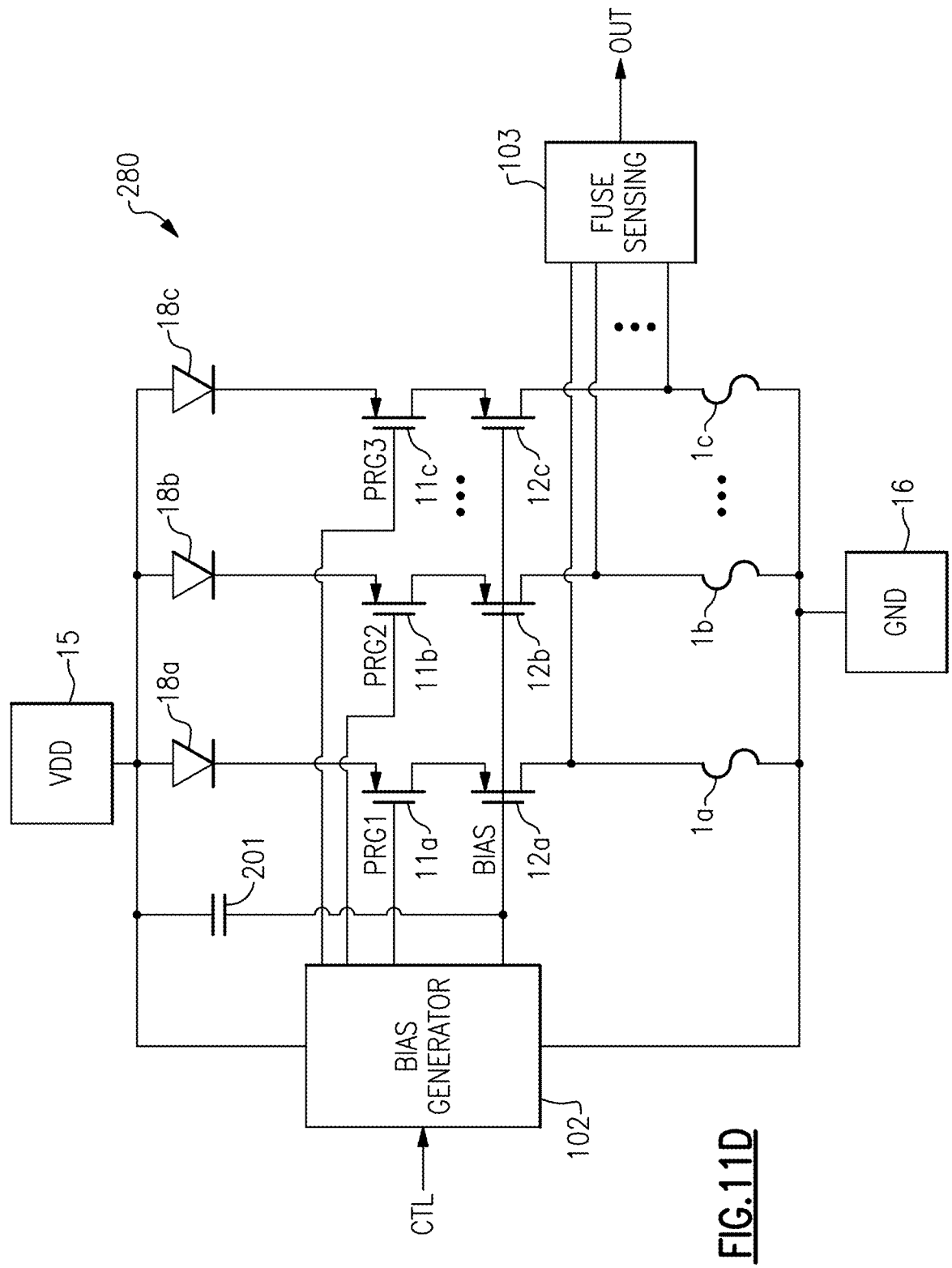
FIG. 11D is a schematic diagram of another embodiment of a fuse system for an IC.

FIG. 11D is a schematic diagram of another embodiment of a fuse system 280 for an IC. The fuse system 280 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, a first fuse protection diode 18a, a second fuse protection diode 18b, a third fuse protection diode 18c, and a shared fuse protection capacitor 201.

The fuse system 280 of FIG. 11D is similar to the fuse system 270 of FIG. 11C, except that the fuse system 280 of FIG. 11D includes separate fuse protection diodes for each fuse cell.

Figure 11E:
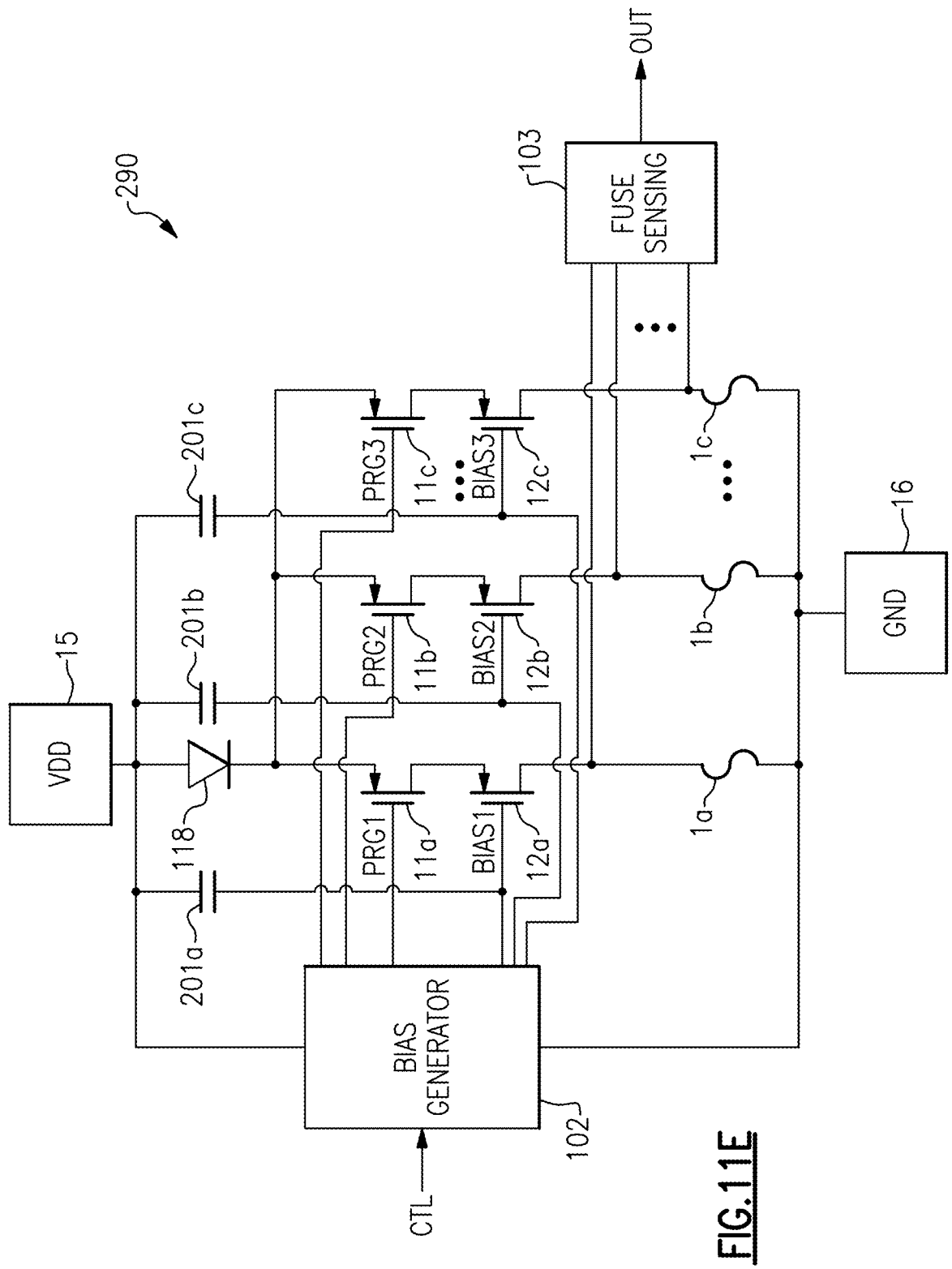
FIG. 11E is a schematic diagram of another embodiment of a fuse system for an IC.

FIG. 11E is a schematic diagram of another embodiment of a fuse system 290 for an IC. The fuse system 290 includes a first fuse cell 1a, a second fuse cell 1b, a third fuse cell 1c, a bias generator 102, a fuse sensing circuit 103, a first fuse programming PFET 11a, a second fuse programming PFET 11b, a third fuse programming PFET 11c, a first cascode PFET 12a, a second cascode PFET 12b, a third cascode PFET 12c, a first pad 15, a second pad 16, a shared fuse protection diode 118, a first fuse protection capacitor 201a, a second fuse protection capacitor 201b, and a third fuse protection capacitor 201c.

The fuse system 290 of FIG. 11E is similar to the fuse system 270 of FIG. 11C, except that the fuse system 290 of FIG. 11E includes separate fuse protection capacitors for each fuse cell.

For example, the bias generator 102 generates a first cascode bias voltage BIAS1 for the first cascode PFET 12a, a second cascode bias voltage BIAS 2 for the second cascode PFET 12b, and a third cascode bias voltage BIAS3 for the third cascode PFET 12c. Additionally, the first fuse protection capacitor 201a is connected between the first cascode bias voltage BIAS1 and the first pad 15, the second fuse protection capacitor 201b is connected between the second cascode bias voltage BIAS2 and the first pad 15, and the third fuse protection capacitor 201c is connected between the third cascode bias voltage BIAS3 and the first pad 15.

Figure 11F:
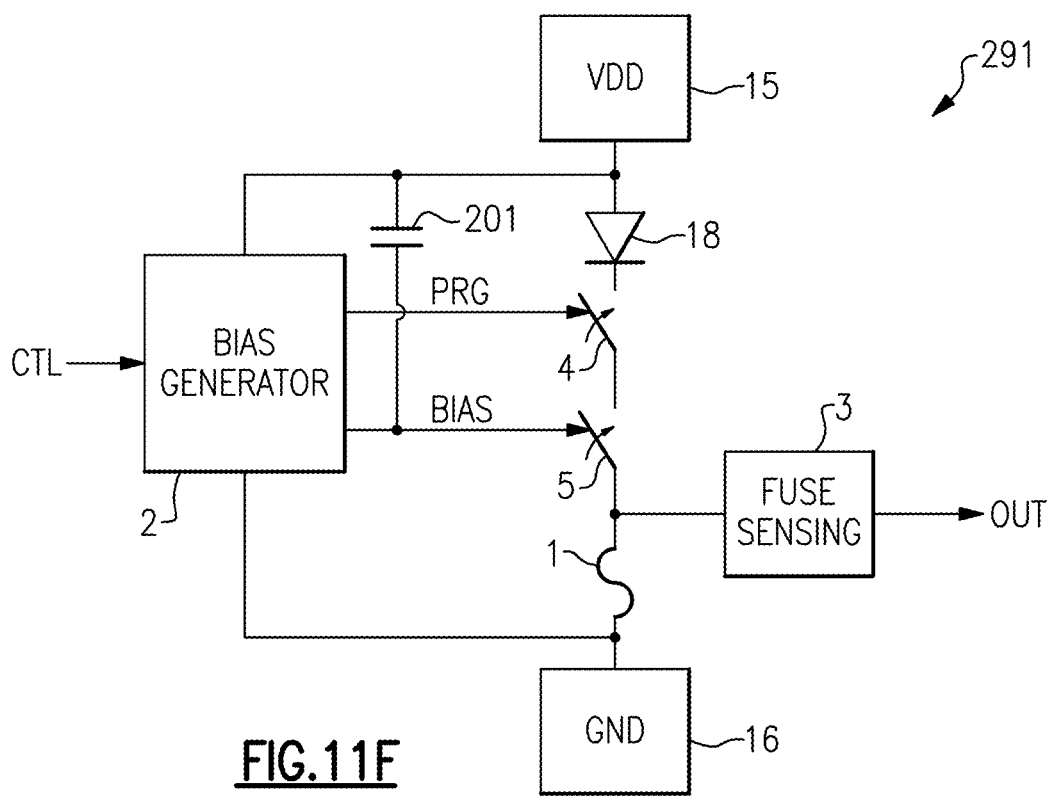
FIG. 11F is a schematic diagram of another embodiment of a fuse system for an IC.

FIG. 11F is a schematic diagram of another embodiment of a fuse system 291 for an IC. The illustrated fuse system 291 includes a fuse cell 1, a biasing circuit 2, a fuse sensing circuit 3, a first switch 4, a second switch 5, a shared power supply and fuse programming pad 15, a ground pad 16, a fuse protection diode 18, and a fuse protection capacitor 201.

The fuse system 291 of FIG. 11F is similar to the fuse system 250 of FIG. 11A, except that the fuse system 291 of FIG. 11F illustrates an embodiment including the first switch 4 and the second switch 5 rather than the fuse programming PFET 11 and the cascode PFET 12. As shown in FIG. 11F, the biasing circuit 2 biases a control input of the first switch 4 with a fuse programming signal PRG (which can be a voltage and/or current) to thereby control a current through the fuse 1. Additionally, the biasing circuit 2 biases a control input of the second switch 5 with a bias signal BIAS (which can be a voltage and/or current). In certain implementations, the first switch 4 and the second switch 5 are implemented as FETs, such as PFETs as in the embodiment of FIG. 11A. However, the first switch 4 and the second switch 5 can correspond to any suitable type of switches.

Although various embodiments are depicted herein in the context of FET implementations, the fuse systems herein can be implemented using a wide variety of types of switches, including, but not limited to, voltage-controlled switches.

Figure 11G:
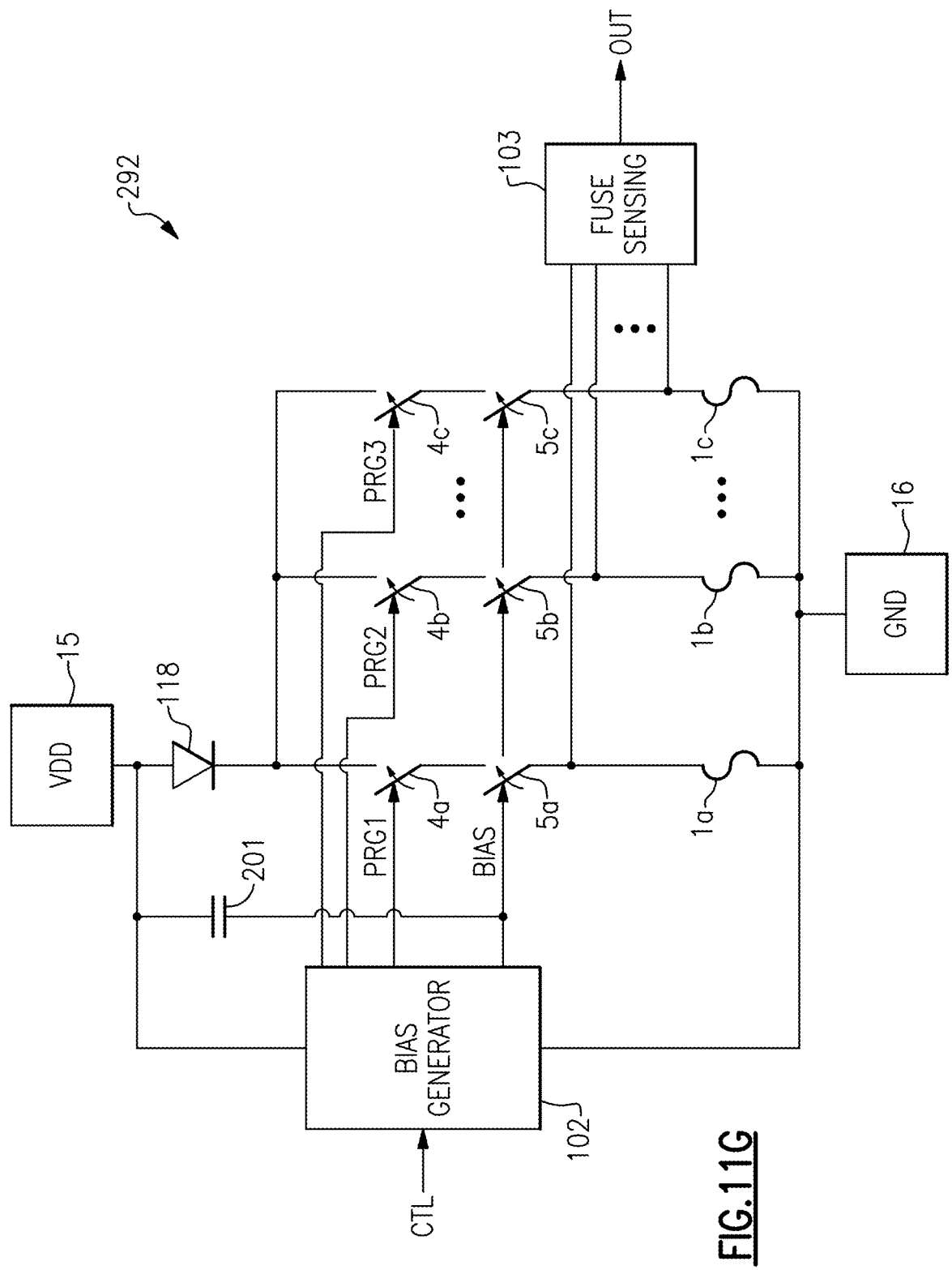
FIG. 11G is a schematic diagram of another embodiment of a fuse system for an IC.

FIG. 11G is a schematic diagram of another embodiment of a fuse system 292 for an IC. The illustrated fuse system 292 includes a first fuse cell 1a, a second fuse cell 1b, a third fuse cell 1c, a bias generator 102, a fuse sensing circuit 103, a first group of switches 4a-4c, a second group of switches 5a-5c, a first pad 15, a second pad 16, a shared fuse protection diode 118, and a shared fuse protection capacitor 201.

The fuse system 292 of FIG. 11G is similar to the fuse system 270 of FIG. 11C, except that the fuse system 292 of FIG. 11G illustrates an embodiment including the first group of switches 4a-4c and the group of switches 5a-5c rather than the fuse programming PFETs 11a-11c and the cascode PFETs 12a-12c.

Examples of Electronic Systems including ICs implemented with a Fuse System

A fuse system can be integrated on a semiconductor die, which in turn can be included in a wide variety of electronic systems.

Figure 12A:
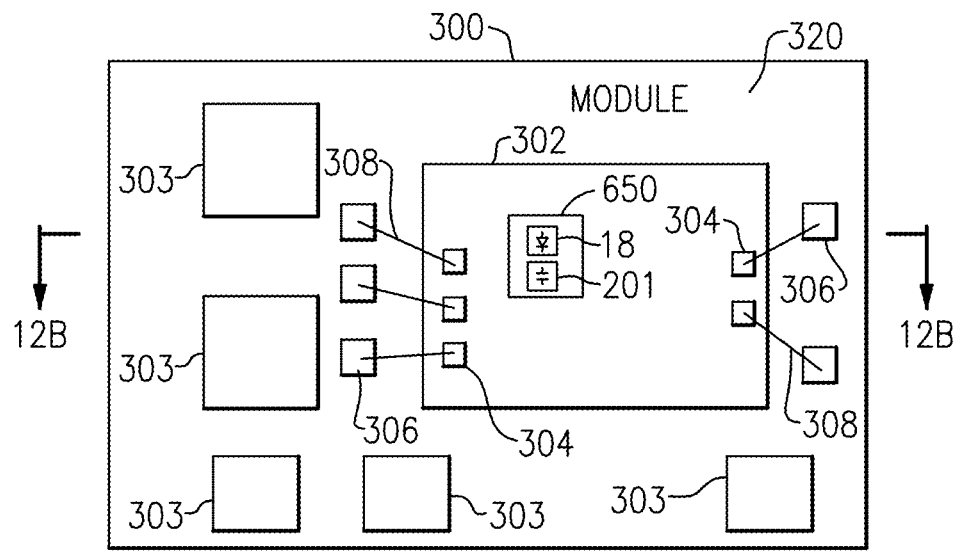
FIG. 12A is a schematic diagram of one embodiment of a packaged module.
Figure 12B:
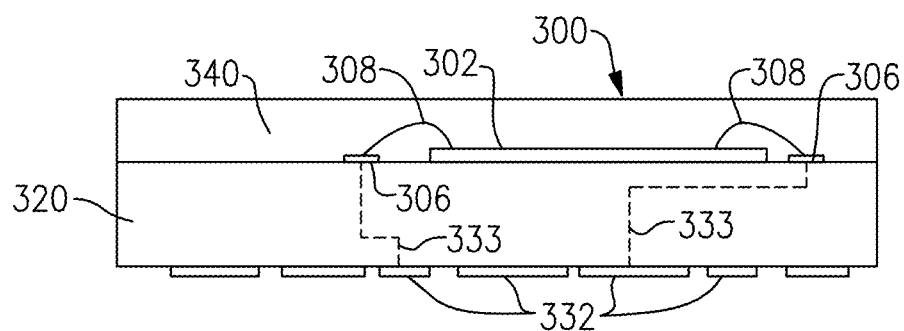
FIG. 12B is a schematic diagram of a cross-section of the packaged module of FIG. 12A taken along the lines 12B-12B.

FIG. 12A is a schematic diagram of one embodiment of a packaged module 300. FIG. 12B is a schematic diagram of a cross-section of the packaged module 300 of FIG. 12A taken along the lines 12B-12B.

The packaged module 300 includes a semiconductor die 302, surface mount components 303, wirebonds 308, a package substrate 320, and encapsulation structure 340. The package substrate 320 includes pads 306 formed from conductors disposed therein. Additionally, the semiconductor die 302 includes pins or pads 304, and the wirebonds 308 have been used to connect the pads 304 of the semiconductor die 302 to the pads 306 of the package substrate 320.

The semiconductor die 302 includes a programmable fuse system 650 that includes at least one of a fuse protection diode 18 or a fuse protection capacitor 201, which can be as described earlier.

The packaging substrate 320 can be configured to receive a plurality of components such as the semiconductor die 302 and the surface mount components 303, which can include, for example, surface mount capacitors and/or inductors.

As shown in FIG. 12B, the packaged module 300 is shown to include a plurality of contact pads 332 disposed on the side of the packaged module 300 opposite the side used to mount the semiconductor die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor die 302 and/or the surface mount components 303. As shown in FIG. 12B, the electrical connections between the contact pads 332 and the semiconductor die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 13:
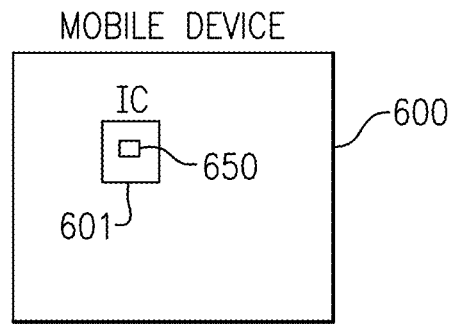
FIG. 13 is a schematic diagram of one embodiment of a mobile device.

FIG. 13 is a schematic diagram of one embodiment of a mobile device 600. The mobile device 600 includes a semiconductor die 601 including a programmable fuse system 650. The programmable fuse system 650 includes at least one of a fuse protection diode or a fuse protection capacitor. Although not illustrated in FIG. 13 for clarity, the mobile device 600 includes additional components and structures.

Figure 14:
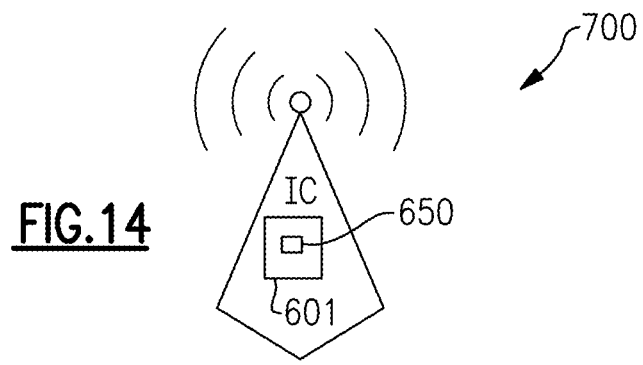
FIG. 14 is a schematic diagram of one embodiment of a base station.

FIG. 14 is a schematic diagram of one embodiment of a base station 700. The base station 700 includes a semiconductor die 601 including a programmable fuse system 650. The programmable fuse system 650 includes at least one of a fuse protection diode or a fuse protection capacitor. Although not illustrated in FIG. 14 for clarity, the base station 700 includes additional components and structures.

Figure 15:
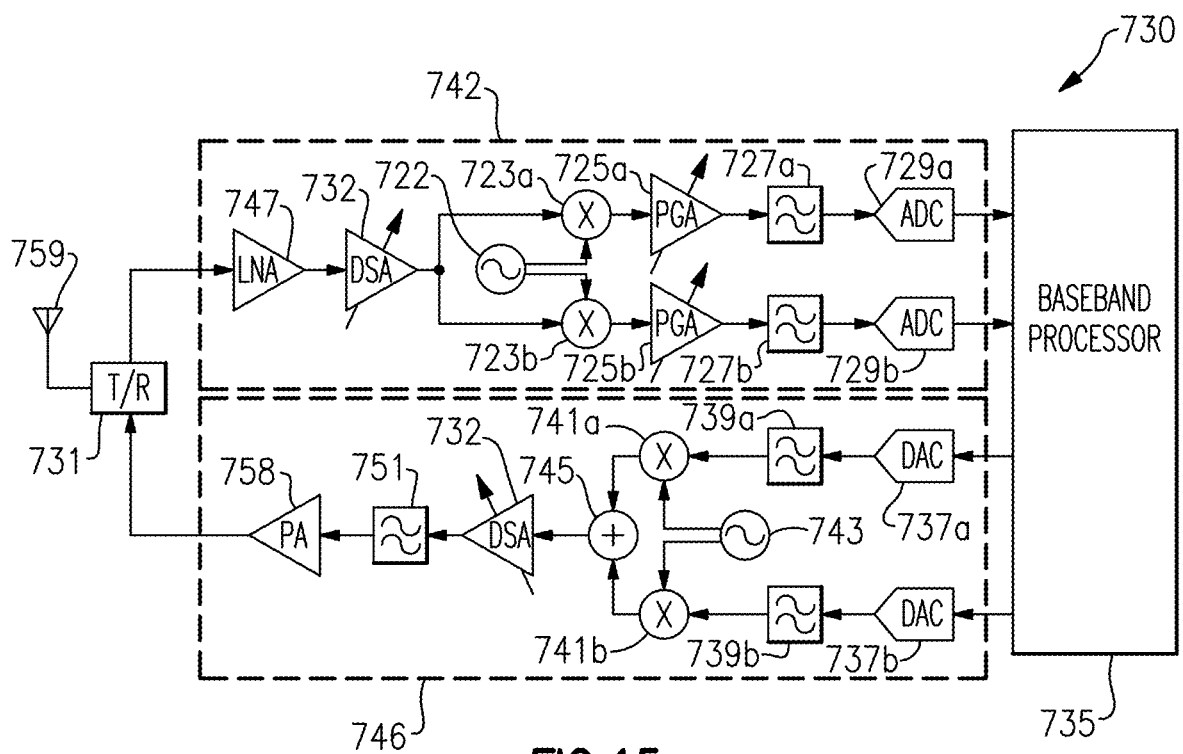
FIG. 15 is a schematic diagram of one embodiment of an RF system.

FIG. 15 is a schematic diagram of one embodiment of an RF system 730. The RF system 730 includes a baseband processor 735, a receive path 742, a transmit path 746, a T/R switch 731, and an antenna 759. The RF system 700 illustrates one example implementation of radio frequency circuitry suitable for operation in the mobile device 600 of FIG. 13 and/or the base station 700 of FIG. 14. However, other implementations are possible.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit path 746 and the receive path 742 can be used for transmitting and receiving signals over the antenna 759. Although one implementation of the RF system 730 is illustrated in FIG. 15, the RF system 730 can be modified in any suitable manner. For example, the base station 730 can be modified to include additional transmit paths, receive paths, and/or antennas.

In the illustrated configuration, the receive path 742 includes a low noise amplifier (LNA) 747, a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive path is illustrated in FIG. 15, a receive path can include more or fewer components and/or a different arrangement of components.

An RF signal can be received on the antenna 759 and provided to the receive path 742 using the T/R switch 731. For example, the T/R switch 731 can be controlled to electrically couple the antenna 759 to an input of the LNA 747, thereby providing the received RF signal to the LNA's input. The LNA 747 provides low noise amplification such that the LNA 747 amplifies the received RF signal while adding or introducing a relatively small amount of noise. As shown in FIG. 15, the amplified RF signal generated by the LNA 747 is provided to the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 735 for processing.

The baseband processor 735 can be implemented in a variety of ways. For instance, the baseband processor 735 can include a digital signal processor, a microprocessor, a programmable core, the like, or any combination thereof. Moreover, in some implementations, two or more baseband processors can be included in the RF system 730.

As shown in FIG. 15, the transmit path 746 receives data from the baseband processor 735 and is used to transmit RF signals via the antenna 759. The transmit path 746 and the receive path 742 both operate using the antenna 759, and access to the antenna 759 is controlled using the T/R switch 731. The illustrated transmit path 746 includes first and second digital-to-analog converters (DACs) 737a, 737b, first and second filters 739a, 739b, first and second mixers 741a, 741b, a local oscillator 743, a combiner 745, a DSA 732, an output filter 751, and a power amplifier 758. Although one implementation of a transmit path is illustrated in FIG. 15, a transmit path can include more or fewer components and/or a different arrangement of components.

The baseband processor 735 can output a digital in-phase (I) signal and a digital quadrature-phase (Q) signal, which can be separately processed until they are combined using the combiner 745. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 743 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 can be amplified by a power amplifier 758. In some implementations, the power amplifier 758 includes a plurality of stages cascaded to achieve a target gain. The power amplifier 758 can provide an amplified RF signal to the antenna 759 through the T/R switch 731.

The programmable fuse systems described herein can be used in the RF system of FIG. 15. For example, the RF system 730 can be implemented using one or more semiconductor dies that include a programmable fuse system. Although FIG. 15 illustrates an example of an RF system that can include a programmable fuse system implemented in accordance with the teachings herein, programmable fuse systems can be used in other configurations of electronics.

Figure 16:
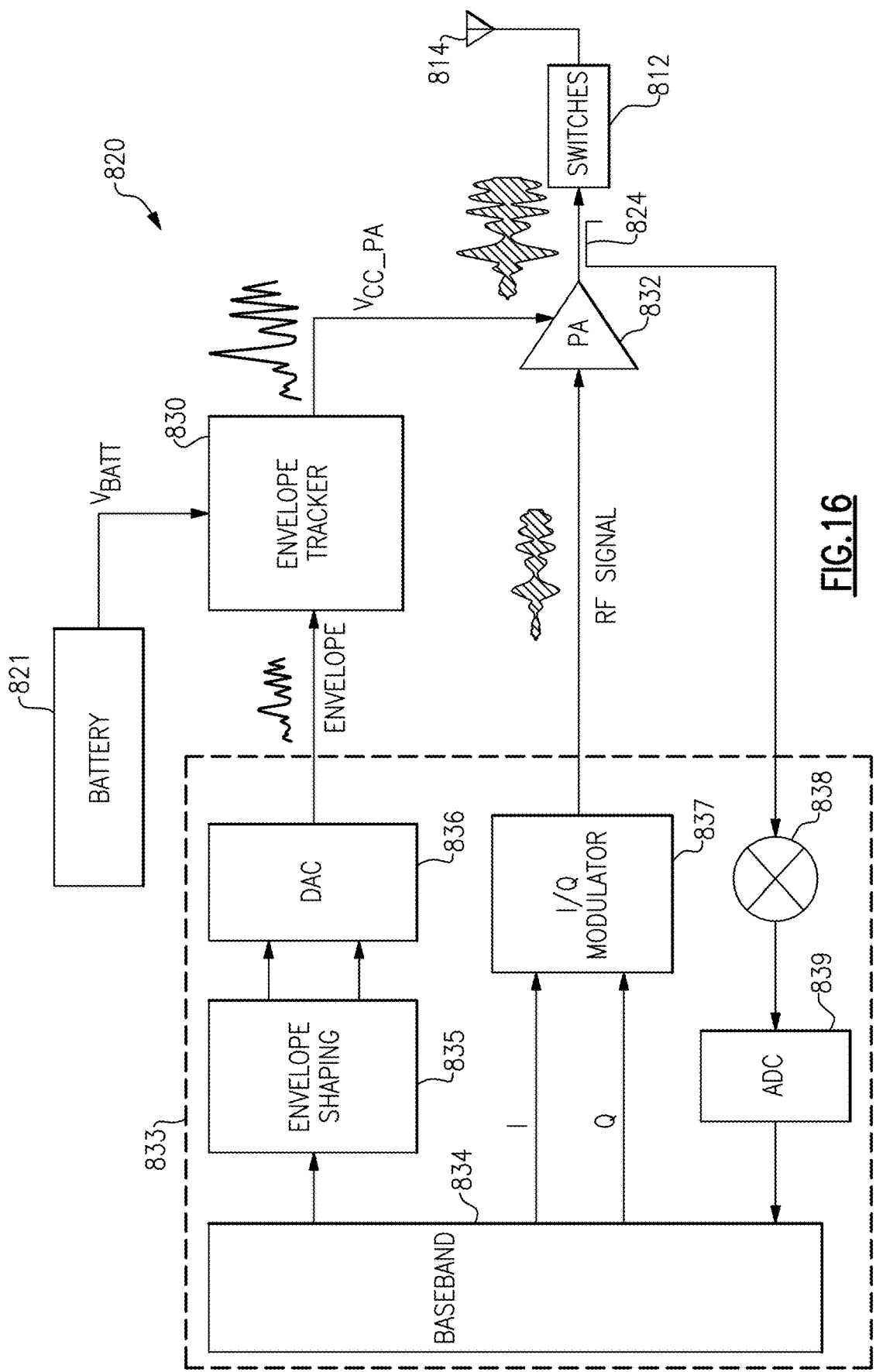
FIG. 16 is a schematic diagram of one example of a power amplifier system.

FIG. 16 is a schematic diagram of one example of a power amplifier system 800. The illustrated power amplifier system 800 includes the switches 812, the antenna 814, the battery 821, a directional coupler 824, the envelope tracker 830, a power amplifier 832, and a transceiver 833. The illustrated transceiver 833 includes a baseband processor 834, an envelope shaping block 835, a digital-to-analog converter (DAC) 836, an I/Q modulator 837, a mixer 838, and an analog-to-digital converter (ADC) 839. Although not illustrated in FIG. 16 for clarity, the transceiver 833 can include circuitry associated with receiving signals over one or more receive paths. The power amplifier system 800 illustrates one example implementation of a power amplifier circuitry suitable for operation in the mobile device 600 of FIG. 13 and/or the base station 700 of FIG. 14. However, other implementations are possible.

The baseband processor 834 can be used to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 837 in a digital format. The baseband processor 834 can be any suitable processor configured to process a baseband signal. For instance, the baseband processor 834 can include a digital signal processor, a microprocessor, a programmable core, or any combination thereof. Moreover, in some implementations, two or more baseband processors 834 can be included in the power amplifier system 800.

The I/Q modulator 837 can be configured to receive the I and Q signals from the baseband processor 834 and to process the I and Q signals to generate an RF signal. For example, the I/Q modulator 837 can include DACs configured to convert the I and Q signals into an analog format, mixers for upconverting the I and Q signals to radio frequency, and a signal combiner for combining the upconverted I and Q signals into an RF signal suitable for amplification by the power amplifier 832. In certain implementations, the I/Q modulator 837 can include one or more filters configured to filter frequency content of signals processed therein.

The envelope shaping block 835 can be used to convert envelope or amplitude data associated with the I and Q signals into shaped envelope data. Shaping the envelope data from the baseband processor 834 can aid in enhancing performance of the power amplifier system 800 by, for example, adjusting the envelope signal to optimize linearity of the power amplifier 32 and/or to achieve a desired gain compression of the power amplifier 832. In certain implementations, the envelope shaping block 835 is a digital block, and the DAC 836 is used to convert the shaped envelope data into an analog envelope signal suitable for use by the envelope tracker 830. However, in other implementations, the DAC 836 can be omitted in favor of providing the envelope tracker 830 with a digital envelope signal to aid the envelope tracker 830 in further processing of the envelope signal.

The envelope tracker 830 can receive the envelope signal from the transceiver 833 and a battery voltage $V_{BATT}$ from the battery 821, and can use the envelope signal to generate a power amplifier supply voltage $V_{CC\_PA}$ for the power amplifier 832 that changes in relation to the envelope. The power amplifier 832 can receive the RF signal from the I/Q modulator 837 of the transceiver 833, and can provide an amplified RF signal to the antenna 814 through the switches 812.

The directional coupler 824 can be positioned between the output of the power amplifier 832 and an input of the switches 812, thereby allowing an output power measurement of the power amplifier 832 that does not include insertion loss of the switches 812. The sensed output signal from the directional coupler 824 can be provided to the mixer 838, which can multiply the sensed output signal by a reference signal of a controlled frequency so as to downshift the frequency spectrum of the sensed output signal. The downshifted signal can be provided to the ADC 839, which can convert the downshifted signal to a digital format suitable for processing by the baseband processor 834.

By including a feedback path between the output of the power amplifier 832 and an input of the baseband processor 834, the baseband processor 834 can be configured to dynamically adjust the I and Q signals and/or envelope data associated with the I and Q signals to optimize the operation of the power amplifier system 800. For example, configuring the power amplifier system 800 in this manner can aid in controlling the power added efficiency (PAE) and/or linearity of the power amplifier 832.

The programmable fuse systems described herein can be used in the power amplifier system 800 of FIG. 16. For example, the power amplifier system 800 can be implemented using one or more semiconductor dies that include a programmable fuse system. Although FIG. 16 illustrates an example of a power amplifier system that can include a programmable fuse system implemented in accordance with the teachings herein, programmable fuse systems can be used in other configurations of electronics.

Figure 17:
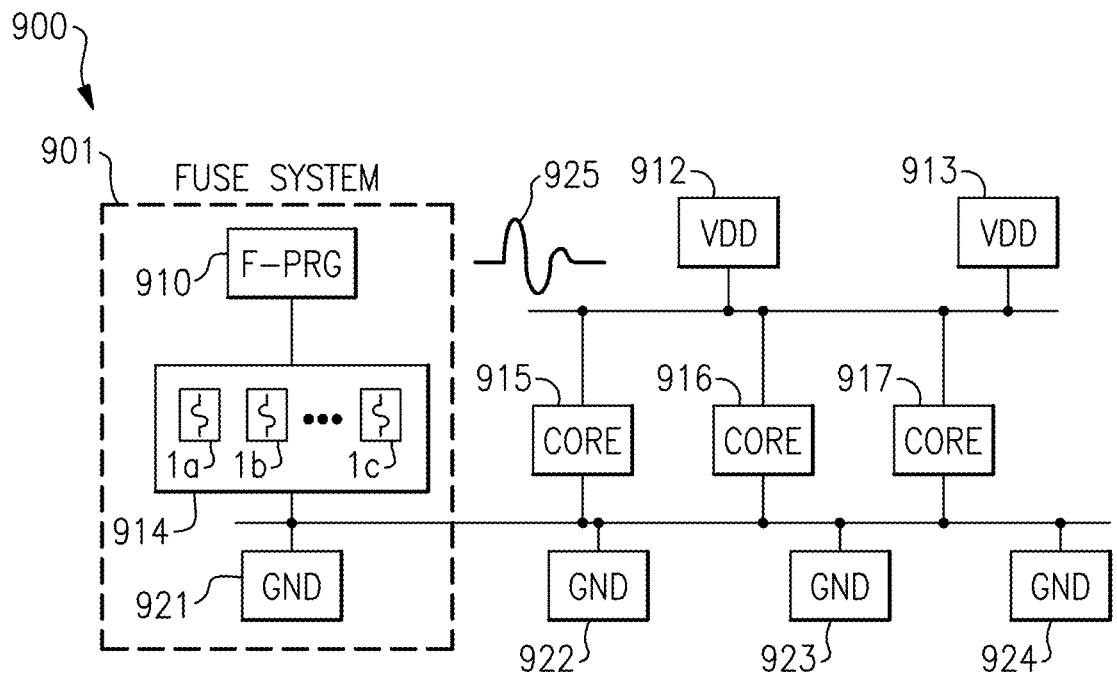
FIG. 17 is a schematic diagram of one embodiment of a semiconductor die with a fuse system.

FIG. 17 is a schematic diagram of one embodiment of a semiconductor die 900 with a fuse system 901. As shown in FIG. 17 the fuse system 901 includes a dedicated fuse programming pad 910, fuse circuitry 914, and a ground pad 921. The fuse circuitry 914 includes fuses 1a-1c (three, in this example), which can be protected using any of the fuse protection schemes disclosed herein. Additionally, the semiconductor die 900 further includes power supply pads 912-913 (two, in this example), core circuits 915-917 (three, in this example), and ground pads 922-924 (three, in this example).

Although one example of a semiconductor die is shown in FIG. 17, other implementations of semiconductor dies are possible, including, but not limited to, dies including more or fewer pads, more or fewer core circuits, and/or more or fewer fuses.

The core circuits 915-917 correspond to circuitry used during normal operation of the semiconductor die 900, for instance, digital, analog, and/or RF circuits that operate to provide a desired function of the chip or die 900. As shown in FIG. 17, the core circuits 915-917 are powered using the power supply pads 912-913 and ground pads 922-924.

The chip's power supply can experience a power supply transient 925, which can be, for example, a relatively rapid voltage transition or glitch. For instance, the power supply transient 925 can arise during turn-on of the semiconductor die 900, during periods of high circuit activity, and/or when the semiconductor die 900 is subjected to electrical overstress, such as an ESD event.

The fuse system 901 operates using a dedicated fuse programming pad 910 that is electrically disconnected from the power supply pads 912-913. Thus, the fuse system 901 is isolated from the power supply transient 925, and thus operates with higher robustness against inadvertent or accidental fuse programming.

Figure 18:
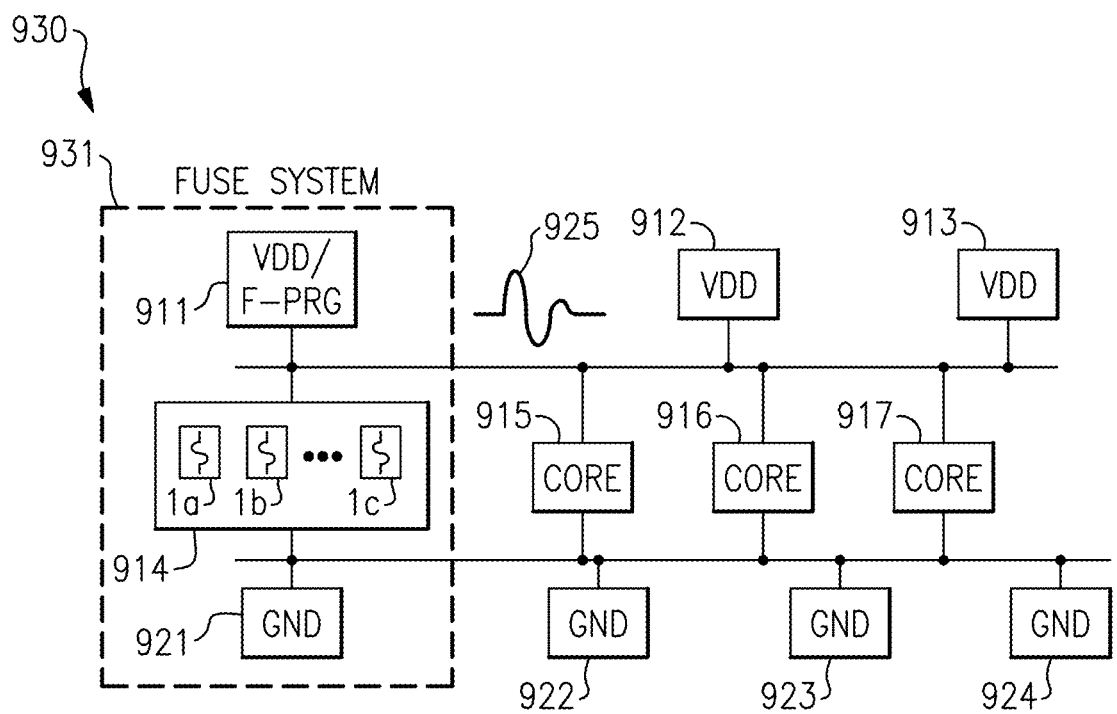
FIG. 18 is a schematic diagram of another embodiment of a semiconductor die with a fuse system.

FIG. 18 is a schematic diagram of another embodiment of a semiconductor die 930 with a fuse system 931. As shown in FIG. 18 the fuse system 931 includes a shared power supply and fuse programming pad 911, fuse circuitry 914, and a ground pad 921.

The semiconductor die 930 of FIG. 18 is similar to the semiconductor die 900 of FIG. 17, except that the semiconductor die 930 of FIG. 18 includes a fuse system 931 that is programmable using a shared power supply and fuse programming pad 911. Thus, rather than providing programming using a dedicated fuse programming pad 910, the pad 911 is used for both fuse programming and for receiving a power supply voltage.

Using a shared power supply and fuse programming pad reduces pin count (for instance, a shared power supply and fuse programming pad can replace a power supply pad and separate fuse programming pad) and/or enhances the quality of power supply distribution by increasing the number of power supply pads that provide power during normal operation. For instance, in comparison to the semiconductor die 900 of FIG. 17, the semiconductor die 930 of FIG. 18 includes an additional power supply pad for powering the core circuits 915-917, and thus can operate with superior power supply distribution.

Although implementing a fuse system with a shared power supply and fuse programming pad advantageously reduces pin count and/or enhances power supply distribution, implementing the fuse system in this manner also exposes the fuse system to power supply transients. For example, the shared power supply and fuse programming pad is connected to a supply voltage during operation of the IC, and thus the fuse system operates with reduced electrical isolation relative to an implementation using a dedicated fuse programming pad. For instance, with respect to the examples shown in FIGS. 17 and 18, the fuse system 931 of FIG. 18 is exposed to the power supply transient 925 while the fuse system 901 of FIG. 17 is isolated from the power supply transient 925.

The fuse protection schemes described herein can provide enhanced robustness against accidental programming of fuses, including, but not limited to, in fuse system implementations using a shared power supply and fuse programming pad.

Figure 19:
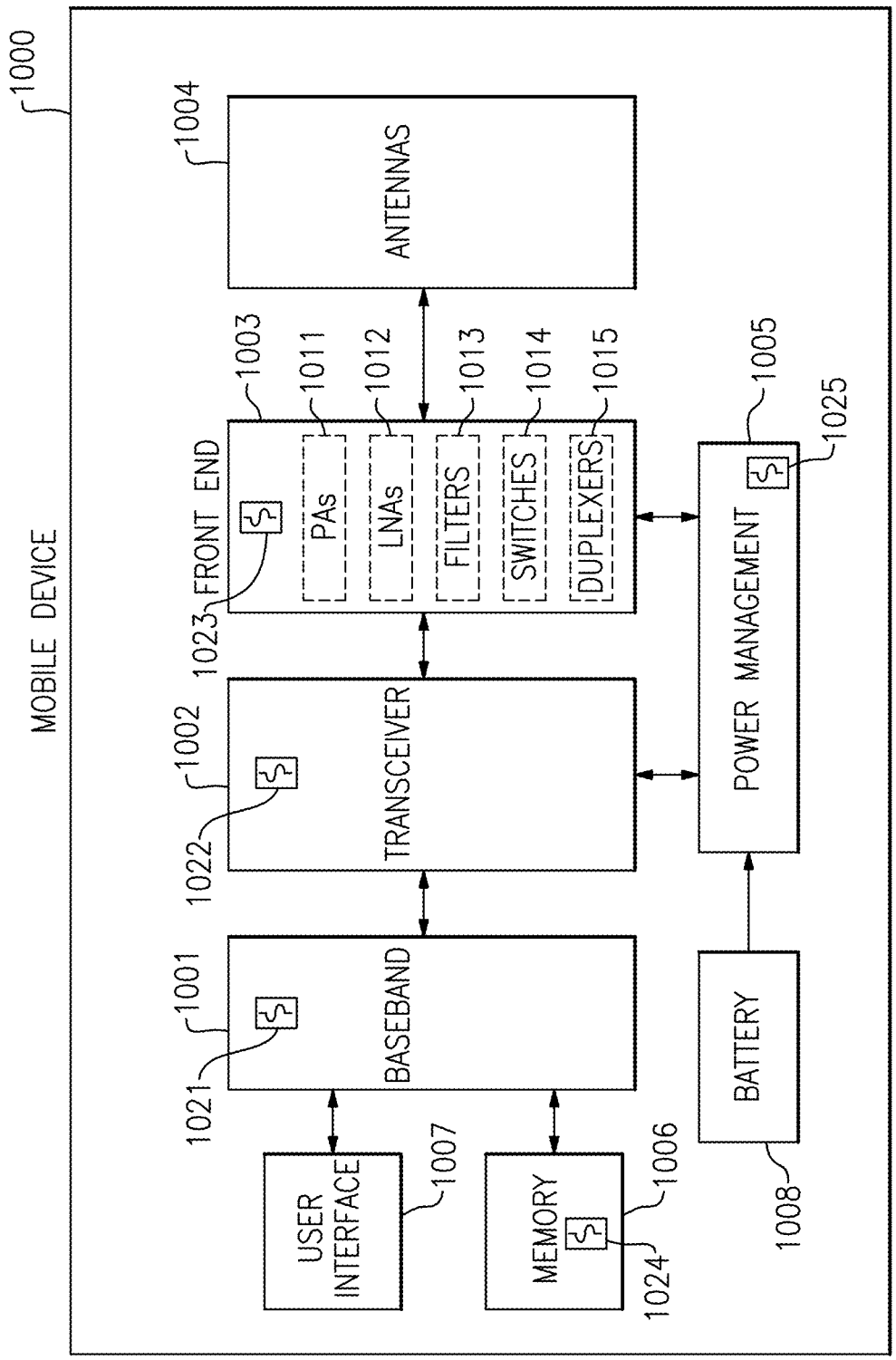
FIG. 19 is a schematic diagram of another embodiment of a mobile device.

FIG. 19 is a schematic diagram of another embodiment of a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 of FIG. 19 can include one or more fuse systems implemented in accordance with the teachings herein. For example, in the illustrated embodiment, the baseband processor 1001 includes a fuse system 1021, the transceiver 1002 includes a fuse system 1022, the front end system 1003 includes a fuse system 1023, the memory 1006 includes a fuse system 1024, and the power management system 1005 includes a fuse system 1025. One or more of the fuse systems 1021-1025 can be implemented in accordance with the teachings herein.

The mobile device 1000 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 19 as the transceiver 1002. In one example, separate components (for instance, separate circuits or dies) can be provided for handling certain types of RF signals.

The front end system 1003 aids is conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. However, other implementations are possible.

For example, the front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1004 can include antennas used for a wide variety of types of communications. For example, the antennas 1004 can include antennas for transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 19, the baseband system 1001 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. In certain implementations, the power management system 1005 includes a PA supply control circuit that controls the supply voltages of the power amplifiers 1011. For example, the power management system 1005 can be configured to change the supply voltage(s) provided to one or more of the power amplifiers 1011 to improve efficiency, such as power added efficiency (PAE).

As shown in FIG. 19, the power management system 1005 receives a battery voltage from the battery 1008. The battery 1008 can be any suitable battery for use in the mobile device 1000, including, for example, a lithium-ion battery.

Applications

Some of the embodiments described above have provided examples in connection with a fuse system integrated on a semiconductor die of an RF system. However, the principles and advantages of the embodiments can be used for any other systems or apparatus that benefit from any of the circuits described herein.

For example, fuse systems can be included in ICs used in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A fuse system for a semiconductor die, the fuse system comprising:
    a fuse protection diode;
    a first fuse;
    a first fuse programming transistor and a first cascode transistor electrically connected in series between a cathode of the fuse protection diode and the first fuse;
    a power supply pad electrically connected to an anode of the fuse protection diode, the power supply pad configured to receive a power supply voltage; and
    a biasing circuit powered by the power supply voltage and including a voltage regulator configured to generate a regulated voltage and a level shifter configured to provide a fuse programming signal to a gate of the first fuse programming transistor, the level shifter configured to control the fuse programming signal with the power supply voltage in a first state of a control signal, and to control the fuse programming signal with the regulated voltage in a second state of the control signal.

2. The fuse system of claim 1 further comprising a serial interface configured to provide the control signal to the biasing circuit to instruct programming of the first fuse.

3. The fuse system of claim 1 further comprising a ground pad configured to receive a ground voltage, the first fuse electrically connected between a drain of the first cascode transistor and the ground pad.

4. The fuse system of claim 1 further comprising a plurality of core circuits powered by the power supply voltage from the power supply pad.

5. The fuse system of claim 1 further comprising a second fuse, a second cascode transistor, and a second fuse programming transistor, the second cascode transistor and the second fuse programming transistor electrically connected in series between the second fuse and the cathode of the fuse protection diode.

6. The fuse system of claim 5 further comprising a shared fuse sensing circuit having a first input electrically connected to the first fuse and a second input electrically connected to the second fuse.

7. The fuse system of claim 1 wherein the voltage regulator is further configured to provide a cascode bias voltage to a gate of the first cascode transistor.

8. The fuse system of claim 7 further comprising a ground pad electrically connected to the first fuse, the voltage regulator further configured to generate the cascode bias voltage based on a voltage difference between the power supply pad and the ground pad.

9. The fuse system of claim 1 wherein the voltage regulator is a low dropout regulator.

10. The fuse system of claim 9 wherein the biasing circuit further includes a bandgap reference circuit powered by the power supply voltage and configured to provide a bandgap reference voltage to the low dropout regulator.

11. A method of protecting against accidental fuse programming, the method comprising:
    providing a power supply voltage to a power supply pad, the power supply pad connected to an anode of a fuse protection diode;
    powering a biasing circuit that biases a fuse programming transistor using the power supply voltage, the fuse programming transistor electrically connected in series with a cascode transistor between a cathode of the fuse protection diode and a fuse;
    generating a regulated voltage using a voltage regulator of the biasing circuit; and providing a gate of the fuse programming transistor with a fuse programming signal from a level shifter of the biasing circuit, including controlling the fuse programming signal with the power supply voltage in a first state of a control signal, and controlling the fuse programming signal with the regulated voltage in a second state of the control signal.

12. The method of claim 11 further comprising providing the control signal to the biasing circuit over a serial interface.

13. The method of claim 11 further comprising providing a cascode bias voltage to a gate of the cascode transistor using the voltage regulator.

14. The method of claim 13 further comprising generating the cascode bias voltage based on a voltage difference between the power supply pad and a ground pad.

15. A packaged module comprising:
a package substrate; and
a semiconductor die attached to the package substrate, the semiconductor die including a fuse protection diode, a first fuse, a first cascode transistor, a first fuse programming transistor electrically connected in series with the first cascode transistor between a cathode of the fuse protection diode and the first fuse, a power supply pad electrically connected to an anode of the fuse protection diode and configured to receive a power supply voltage, and a biasing circuit powered by the power supply voltage and including a voltage regulator configured to generate a regulated voltage and a level shifter configured to provide a fuse programming signal to a gate of the first fuse programming transistor, the level shifter configured to control the fuse programming signal with the power supply voltage in a first state of a control signal, and to control the fuse programming signal with the regulated voltage in a second state of the control signal.

16. The packaged module of claim 15 wherein the semiconductor die further includes a second fuse, a second cascode transistor, and a second fuse programming transistor, the second cascode transistor and the second fuse programming transistor electrically connected in series between the second fuse and the cathode of the fuse protection diode.

17. The packaged module of claim 16 wherein the semiconductor die further includes a shared fuse sensing circuit having a first input electrically connected to the first fuse and a second input electrically connected to the second fuse.

18. The packaged module of claim 15 wherein the semiconductor die further includes a plurality of core circuits powered by the power supply voltage from the power supply pad.

19. The packaged module of claim 15 wherein the voltage regulator is further configured to provide a cascode bias voltage to a gate of the first cascode transistor.

20. The packaged module of claim 19 wherein the semiconductor die further includes a ground pad electrically connected to the first fuse, the voltage regulator further configured to generate the cascode bias voltage based on a voltage difference between the power supply pad and the ground pad.

* * * * *